United States Patent
Zaytsev et al.

(10) Patent No.: US 11,995,812 B2
(45) Date of Patent: May 28, 2024

(54) NEXT GENERATION QUALITY INSPECTION

(71) Applicant: Electrical Components International, Inc., St. Louis, MO (US)

(72) Inventors: Kyryll Zaytsev, Montreal (CA); Jarred Knecht, Montreal (CA); Hafizur Md Rahman, Montreal (CA); Ahmad Raza, Surrey (CA); Prabhjyot Gill, Montreal (CA); Vikrant Vikrant, Montreal (CA); Sandeep Annabathuni, Longueuil (CA)

(73) Assignee: Electrical Components International, Inc., St. Louis, MO (US)

( * ) Notice: Subject to any disclaimer, the term of this patent is extended or adjusted under 35 U.S.C. 154(b) by 0 days.

(21) Appl. No.: 17/853,188

(22) Filed: Jun. 29, 2022

(65) Prior Publication Data

US 2024/0005471 A1 Jan. 4, 2024

(51) Int. Cl.
*G06T 7/00* (2017.01)
*G06V 10/25* (2022.01)
(Continued)

(52) U.S. Cl.
CPC ............ *G06T 7/0004* (2013.01); *G06V 10/25* (2022.01); *G06V 10/764* (2022.01);
(Continued)

(58) Field of Classification Search
None
See application file for complete search history.

(56) References Cited

U.S. PATENT DOCUMENTS

| 2003/0163917 A1* | 9/2003 | Davidshofer | H01R 43/28 29/748 |
| 2004/0103531 A1 | 6/2004 | Shirakawa et al. | |

(Continued)

FOREIGN PATENT DOCUMENTS

| CN | 101865667 A | * 10/2010 | ............. G01N 21/27 |
| CN | 101865667 B | * 10/2012 | ............. G01N 21/27 |

(Continued)

OTHER PUBLICATIONS

International Search Report and the Written Opinion of the International Searching Authority, issued in corresponding International Application No. PCT/US 23/26470, dated Sep. 29, 2023, 23 pages.

*Primary Examiner* — Reza Aghevli
(74) *Attorney, Agent, or Firm* — Rothwell, Figg, Ernst & Manbeck, P.C.

(57) ABSTRACT

Methods and systems for inspecting a product, such as a wire harness, including product features for inspection. A camera of an inspection station may capture a product image. A machine learning (ML) model may detect one or more objects in the captured product image and provide, for each detected object, an identification of a class of the detected object and an identification of a region of the detected object in the captured product image. The class of the detected object may be either an acceptable product feature class or an unacceptable product feature class. The inspection station may display an enhanced product image that includes the captured product image to which the identification of the class of the detected object and the identification of the region of the detected object in the captured product image for each detected object have been added.

29 Claims, 45 Drawing Sheets

(51) Int. Cl.
*G06V 10/764* (2022.01)
*G06V 10/77* (2022.01)
*G06V 10/774* (2022.01)
*H03M 7/30* (2006.01)
*H04N 7/18* (2006.01)
*H04N 23/56* (2023.01)
*H03M 3/00* (2006.01)
*H03M 7/32* (2006.01)

(52) U.S. Cl.
CPC ...... *G06V 10/7715* (2022.01); *G06V 10/7747* (2022.01); *H04N 7/183* (2013.01); *H04N 23/56* (2023.01); *G06T 2207/30164* (2013.01); *H03M 3/412* (2013.01); *H03M 7/302* (2013.01)

(56) References Cited

U.S. PATENT DOCUMENTS

| | | | |
|---|---|---|---|
| 2018/0023248 A1* | 1/2018 | Davis | G02B 6/4436 428/375 |
| 2019/0073566 A1 | 3/2019 | Brauer | |
| 2019/0294883 A1 | 9/2019 | Pathak et al. | |
| 2020/0005449 A1 | 1/2020 | Ambikapathi et al. | |
| 2020/0134773 A1 | 4/2020 | Pinter et al. | |
| 2021/0049754 A1 | 2/2021 | Ortega | |
| 2021/0318673 A1 | 10/2021 | Kitchen et al. | |
| 2022/0028054 A1 | 1/2022 | Harmen et al. | |
| 2022/0092765 A1 | 3/2022 | Song et al. | |

FOREIGN PATENT DOCUMENTS

| | | | | |
|---|---|---|---|---|
| CN | 212989148 U | * | 4/2021 | ............. G01B 11/02 |
| CN | 215449049 U | * | 1/2022 | ............ H01R 43/048 |
| CN | 216389993 U | * | 4/2022 | ............. G01B 11/02 |
| EP | 1043813 A1 | * | 10/2000 | ........... H01R 43/048 |
| EP | 3142128 A1 | * | 3/2017 | ....... H01B 13/01227 |
| JP | 2016162660 A | * | 9/2016 | ....... H01B 13/01227 |
| JP | 2016223869 A | * | 12/2016 | ............. G01N 21/27 |
| JP | 2018084542 A | * | 5/2018 | ............. G01B 11/02 |
| JP | 2018087750 A | * | 6/2018 | ............. G01B 11/02 |
| JP | 2019060685 A | * | 4/2019 | ............. G01M 3/141 |
| JP | 2019219360 A | * | 12/2019 | ....... H01B 13/01209 |
| JP | 2019220443 A | * | 12/2019 | ............. G01B 11/02 |
| JP | 2023075133 A | * | 5/2023 | ............. G01B 11/02 |
| KR | 1782289 B1 | * | 10/2017 | ............. G01M 3/141 |
| KR | 2000920 B1 | * | 10/2019 | ......... G01N 21/8806 |
| KR | 2181524 B1 | * | 11/2020 | ............. G01B 11/02 |
| WO | WO-2018100986 A1 | * | 6/2018 | ............. G01B 11/02 |
| WO | 2020/139195 A1 | | 7/2020 | |

* cited by examiner

NEXT GENERATION QUALITY INSPECTION

BACKGROUND

Field of Invention

The present invention relates generally to methods and systems for inspection of a product (e.g., a wire harness) using a machine learning (ML) model to detect acceptable and unacceptable product features.

Discussion of the Background

Wire harnesses (also known as cable harnesses, cable assemblies, wiring assemblies, or wiring looms) are assemblies of electrical cables or wires that transmit signal and/or electrical power. Wire harnesses are commonly used in, for example, a vehicle, such as, an automobile, a heavy duty transportation vehicle, such as a semi-truck, a train, a trolley or a cable car, a construction machine, a watercraft, such as a cargo vessel, an inter-island boat or a jet ski, and a spacecraft. Wire harnesses are primarily manufactured by hand. Wire harnesses are inspected during one or more stages of their manufacture to ensure quality and/or functionality. Inspection by human inspectors is time consuming, especially where inspection is required at multiple stages of manufacture.

Automated optical inspection (AOI) systems are used for automated visual inspection of products such as printed circuit boards (PCBs). However, AOI systems require extensive programming of what acceptable and unacceptable product features are including specific dimensional tolerances, which must be developed and loaded manually by the operator. Moreover, conventionally programmed AOI systems are not adaptable or flexible, and instead require re-programming if the environment (e.g., lighting) changes or if there are small variations in the product features. That is, conventionally programmed AOI systems require static dimensional tolerances, and, if part-to-part variation is allowed, the static dimensional tolerances are wider than necessary.

SUMMARY

Aspects of the invention may overcome one or more of the problems associated with conventional AOI systems by training artificial intelligence (AI) (e.g., a machine learning (ML) model) what good/acceptable and bad/unacceptable features of a product (e.g., a wire harness) are. Some aspects of the invention may use a trained ML model to detect acceptable and unacceptable features of a product (e.g., at one or more stages of assembling the product), store the detected product features, and determine that a product is acceptable (e.g., if only acceptable product features were detected for the product). In some aspects, each product may include a label including a product identification (ID), and every captured product image may be stored digitally along with any detected product features, the product ID, and/or an identification of an inspection station that captured the product image.

Some aspects of the invention may use a custom-engineered optical system to achieve automated inspection using an ML model. In some aspects, the optical system may include a camera (e.g., a 13MP 4k HD camera), a light (e.g., an LED ring light), and/or one or more focal distances. In some aspects, the one or more focal distances may be defined by a stand on which the camera is mounted. In some aspects, with the optical system, the ML model may be capable of detecting, for example, a wire braid that is unacceptable because a wire braid strand is out of place.

In some aspects, the inspection system may employ video-based AI in a continuous learning mode that feeds data frame-by-frame into a server computer system for analysis by the ML model. In some aspects, the inspection system may identify regions of the frame and define bounding boxes for acceptable or unacceptable product features using a probability calculation for regions of the frame. In some aspects, the inspection system may integrate multiple probability calculations indicative of acceptable or unacceptable product features to make a mathematical decision on an acceptable product.

In some aspects, the next generation inspection system including the optical system and ML model may be applied, for example, to ensure the quality of wire harnesses for mission critical high voltage autonomous vehicle systems (e.g., steering or braking systems).

One aspect of the invention may provide a method performed by an inspection system. The method may include using a camera of an inspection station to output a video stream including captured product images of a product in a field of view of the camera. A stand of the inspection station may be configured to position the camera, and the product may include one or more product features. The method may include using an inspection station computer system of the inspection station to receive the video stream. The method may include using the inspection station computer system to convey a captured product image of the captured product images. The method may include using a server computer system to receive the conveyed captured product image. The method may include using a machine learning (ML) model of the server computer system to detect one or more objects in the captured product image and provide, for each of the detected one or more objects, an identification of a class of the detected object and an identification of a region of the detected object in the captured product image. The class of the detected object may be either an acceptable product feature class or an unacceptable product feature class. The method may include using the inspection station computer system to receive, for each of the detected one or more objects, the identification of the class of the detected object and the identification of the region of the detected object in the captured product image. The method may include using the inspection station computer system to cause a display of the inspection station to display an enhanced product image that includes the conveyed captured product image to which the identification of the class of the detected object and the identification of the region of the detected object in the captured product image for each of the detected one or more objects have been added.

In some aspects, the method may further include using the server computer system to create the enhanced product image by adding the identification of the class of the detected object and the identification of the region of the detected object in the captured product image for each of the detected one or more objects to the conveyed captured product image, and using the inspection station computer system to receive, for each of the detected one or more objects, the identification of the class of the detected object and the identification of the region of the detected object in the captured product image comprises receiving the enhanced product image. In some alternative aspects, the method may further include using the inspection station computer system to create the enhanced product image by adding the identification of the class of the detected object and the identification of the region of the detected object in the captured product image for each of the detected one or more objects to the conveyed captured product image.

In some aspects, using the ML model of the server computer system to detect the one or more objects in the captured product image may include: for each class of a set of classes, using the ML model of the server computer system to determine a probability that the captured product image includes an object of the class in a region of the captured product image; and for each determined probability that exceeds a probability threshold, determining that the region of the captured product image includes the object of the class. In some aspects, the product may be a wire harness, and the set of classes may include two or more of the following classes: an acceptable endcap placement class, an unacceptable endcap placement class, an acceptable tie wrap class, an unacceptable tie wrap class, an acceptable sleeve placement class, an unacceptable sleeve placement class, an acceptable crimp class, an unacceptable crimp class, an acceptable jacket placement class, an unacceptable jacket placement class, an acceptable placed lugs class, an unacceptable placed lugs class, an acceptable heated heat shrink class, an unacceptable heated heat shrink class, an acceptable weld class, an unacceptable weld class, an acceptable shield braid class, and an unacceptable shield braid class.

In some aspects, the product may be a wire harness, and the one or more product features may be wire harness features.

In some aspects, the method may further include training the ML model of the server computer system. In some aspects, training the ML model may include: loading a training dataset to the server computer system and training the ML model using the loaded training dataset. In some aspects, the training dataset may include training product images and, for each training product image of the training product images, an identification of a class of an object in the training product image and an identification of a region of the object in the training product image. In some aspects, the class of the object may be either an acceptable product feature class or an unacceptable product feature class.

In some aspects, training the ML model may further include using a camera of a training station to output a video stream including images of a training product in a field of view of the camera of the training station and using a training station computer system of the training station to receive the video stream output by the camera of the training station. In some aspects, a stand of the training station may be configured to position the camera, and the training product images may include one or more of the images of the training product in the field of view of the camera of the training station. In some aspects, training the ML model may further include using a robot arm of the training station to position the training product in the field of view of the camera of the training station.

In some aspects, the method may further include using a light of the inspection station to illuminate the product in the field of view of the camera, and the stand of the inspection station may position the light. In some aspects, the light of the inspection station may be a light emitting diode (LED) ring light.

In some aspects, the camera of the inspection station may have a resolution of at least 13MP. In some aspects, the video output by the camera of the inspection station may have at least a 4K resolution.

In some aspects, the method may further include using an image repository to store the conveyed captured product image and, for each of the detected one or more objects, the identification of the class of the detected object and the identification of the region of the detected object in the captured product image.

Another aspect of the invention may provide an inspection system may include an inspection station and a server computer system. The inspection station may include a camera, a stand, and a display. The camera may be configured to output a video stream including captured product images of a product in a field of view of the camera, and the product may include one or more product features. The stand may be configured to position the camera. The inspection station computer system may be configured to receive the video stream and convey a captured product image of the captured product images. The server computer system may include a machine learning (ML) model. The server computer system may be configured to receive the conveyed captured product image. The server computer system may be configured to use the ML model of the server computer system to detect one or more objects in the captured product image and provide, for each of the detected one or more objects, an identification of a class of the detected object and an identification of a region of the detected object in the captured product image. The class of the detected object may be either an acceptable product feature class or an unacceptable product feature class. The inspection station computer system may be further configured to receive, for each of the detected one or more objects, the identification of the class of the detected object and the identification of the region of the detected object in the captured product image. The inspection station computer system may be further configured to cause the display to display an enhanced product image that includes the conveyed captured product image to which the identification of the class of the detected object and the identification of the region of the detected object in the captured product image for each of the detected one or more objects have been added.

In some aspects, the server computer system may be further configured to create the enhanced product image by adding the identification of the class of the detected object and the identification of the region of the detected object in the captured product image for each of the detected one or more objects to the conveyed captured product image, and the inspection station computer system may be further configured to, in receiving, for each of the detected one or more objects, the identification of the class of the detected object and the identification of the region of the detected object in the captured product image, receiving the enhanced product image. In some alternative aspects, the inspection station computer system is further configured to create the enhanced product image by adding the identification of the class of the detected object and the identification of the region of the detected object in the captured product image for each of the detected one or more objects to the conveyed captured product image.

In some aspects, the server computer system, in detecting one or more objects in the captured product image, is configured to: for each class of a set of classes, use the ML model to determine a probability that the captured product image includes an object of the class in a region of the captured product image; and, for each determined probability that exceeds a probability threshold, determine that the region of the captured product image includes the object of the class. In some aspects, the product may be a wire harness, and the set of classes may include two or more of the following classes: an acceptable endcap placement class, an unacceptable endcap placement class, an acceptable tie wrap class, an unacceptable tie wrap class, an acceptable sleeve placement class, an unacceptable sleeve placement class, an acceptable crimp class, an unacceptable crimp class, an acceptable jacket placement class, an unacceptable jacket placement class, an acceptable placed lugs class, an unacceptable placed lugs class, an acceptable heated heat shrink class, an unacceptable heated heat shrink class, an acceptable weld class, an unacceptable weld class, an acceptable shield braid class, and an unacceptable shield braid class.

In some aspects, the product may be a wire harness, and the one or more product features may be wire harness features.

In some aspects, the server computer system may be further configured to train the ML model using a training dataset that includes training product images and, for each training product image of the training product images, an identification of a class of an object in the training product image and an identification of a region of the object in the training product image, and the class of the object may be either an acceptable product feature class or an unacceptable product feature class.

In some aspects, the inspection system may further include a training station. The training station may include a camera, a stand, and a training station computer system. The camera may be configured to output a video stream including images of a training product in a field of view of the camera of the training station, and the training product images may include one or more of the images of the training product in the field of view of the camera of the training station. The stand may be configured to position the camera of the training station. The training station computer system may be configured to receive the video stream output by the camera of the training station. In some aspects, the training station may further include a robot arm configured to position the training product in the field of view of the camera of the training station.

In some aspects, the inspection station may further include a light configured to illuminate the product in the field of view of the camera, and the stand of the inspection station may be configured to position the light. In some aspects, the light of the inspection station may be a light emitting diode (LED) ring light.

In some aspects, the camera of the inspection station may have a resolution of at least 13MP. In some aspects, the video output by the camera of the inspection station may have at least a 4K resolution.

In some aspects, the inspection system may further include an image repository configured to store the conveyed captured product image and, for each of the detected one or more objects, the identification of the class of the detected object and the identification of the region of the detected object in the captured product image.

Still another aspect of the invention may provide a method performed by an inspection system. The method may include receiving captured product images of a product including multiple product features, and each of the multiple product features may be visible in at least one of the captured product images. The method may include using a machine learning (ML) model to detect objects in the captured product images and, for each detected object, provide an identification of a class of the detected object and an identification of a region of the detected object in the captured product image of the captured product images in which the object was detected. The class of the detected object may be one of a set of classes including, for each of product feature of the multiple product features, an acceptable product feature class and an unacceptable product feature class. The method may include determining that the product is unacceptable if, for any of the multiple product features, the class of the detected object is the unacceptable product feature class for the product feature. The method may include determining that the product is acceptable if, for each of the multiple product features, the class of the detected object is the acceptable product feature class for the product feature.

In some aspects, the method may further include capturing one or more of the captured product images at a first stage of assembly of the product and capturing one or more of the captured product images at a second stage of assembly of the product, and the second stage may be different than the first stage.

In some aspects, using the ML model to detect objects in the captured product images may include, for each captured product image of the captured product images: for each class of the set of classes, using the ML model of the server computer system to determine a probability that the captured product image includes an object of the class in a region of the captured product image; and, for each determined probability that exceeds a probability threshold, determining that the region of the captured product image includes the object of the class.

In some aspects, the product may be a wire harness, and the set of classes may include two or more of the following classes: acceptable endcap placement, unacceptable endcap placement, acceptable tie wrap, unacceptable tie wrap, acceptable sleeve placement, unacceptable sleeve placement, acceptable crimp, unacceptable crimp, acceptable jacket placement, unacceptable jacket placement, acceptable placed lugs, unacceptable placed lugs, acceptable heated heat shrink, unacceptable heated heat shrink, acceptable weld, unacceptable weld, acceptable shield braid, and unacceptable shield braid.

In some aspects, the method may further include training the ML model. In some aspects, training the ML model may include using a training dataset to train the ML model, the training dataset may include training product images and, for each training product image of the training product images, an identification of a class of an object in the training product image and an identification of a region of the object in the training product image, and the class of the object may be either an acceptable product feature class or an unacceptable product feature class.

Yet another aspect of the invention may provide an inspection system. The inspection system may be configured to receive captured product images of a product including multiple product features, and each of the multiple product features may be visible in at least one of the captured product images. The inspection system may be configured to use a machine learning (ML) model to detect objects in the captured product images and, for each detected object, provide an identification of a class of the detected object and an identification of a region of the detected object in the captured product image of the captured product images in which the object was detected. The class of the detected object may be one of a set of classes including, for each of product feature of the multiple product features, an acceptable product feature class and an unacceptable product feature class. The inspection system may be configured to determine that the product is unacceptable if, for any of the multiple product features, the class of the detected object is the unacceptable product feature class for the product feature. The inspection system may be configured to determine that the product is acceptable if, for each of the multiple product features, the class of the detected object is the acceptable product feature class for the product feature.

In some aspects, the inspection system may be further configured to capture one or more of the captured product images at a first stage of assembly of the product and to capture one or more of the captured product images at a second stage of assembly of the product, and the second stage may be different than the first stage.

In some aspects, in using the ML model to detect objects in the captured product images, the inspection system may be configured to, for each captured product image of the captured product images: (1) for each class of the set of classes, use the ML model of the server computer system to determine a probability that the captured product image includes an object of the class in a region of the captured product image; and (2) for each determined probability that exceeds a probability threshold, determine that the region of the captured product image includes the object of the class.

In some aspects, the product may be a wire harness, and the set of classes may include two or more of the following classes: acceptable endcap placement, unacceptable endcap placement, acceptable tie wrap, unacceptable tie wrap, acceptable sleeve placement, unacceptable sleeve placement, acceptable crimp, unacceptable crimp, acceptable jacket placement, unacceptable jacket placement, acceptable placed lugs, unacceptable placed lugs, acceptable heated heat shrink, unacceptable heated heat shrink, acceptable weld, unacceptable weld, acceptable shield braid, and unacceptable shield braid.

In some aspects, the inspection system may be further configured to train the ML model. In some aspects, in training the ML model, the inspection system may be configured to use a training dataset to train the ML model. In some aspects, the training dataset may include training product images and, for each training product image of the training product images, an identification of a class of an object in the training product image and an identification of a region of the object in the training product image. In some aspects, the class of the object may be either an acceptable product feature class or an unacceptable product feature class.

Still another aspect of the invention may provide a computer program including instructions for adapting an inspection system to perform the method of any of the above aspects. Yet another aspect of the invention may provide a carrier containing the computer program, and the carrier may be one of an electronic signal, optical signal, radio signal, or compute readable storage medium.

Still another aspect of the invention may provide an inspection system may include processing circuitry and a memory. The memory may contain instructions executable by the processing circuitry, whereby the apparatus is operative to perform the method of any of the aspects above.

Yet another aspect of the invention may provide an inspection system adapted to perform the method of any of the methods above.

Still another aspect of the invention may provide any combination of the aspects set forth above.

Further variations encompassed within the systems and methods are described in the detailed description of the invention below.

BRIEF DESCRIPTION OF THE DRAWINGS

The accompanying drawings, which are incorporated herein and form part of the specification, illustrate various, non-limiting embodiments of the present invention. In the drawings, like reference numbers indicate identical or functionally similar elements.

FIGS. 8C and 8D illustrate capture of a product image and display of an enhanced product image according to some aspects.

FIG. 8E illustrates a list of objects detected during assembly of a product according to some aspects.

DETAILED DESCRIPTION

Figure 1:
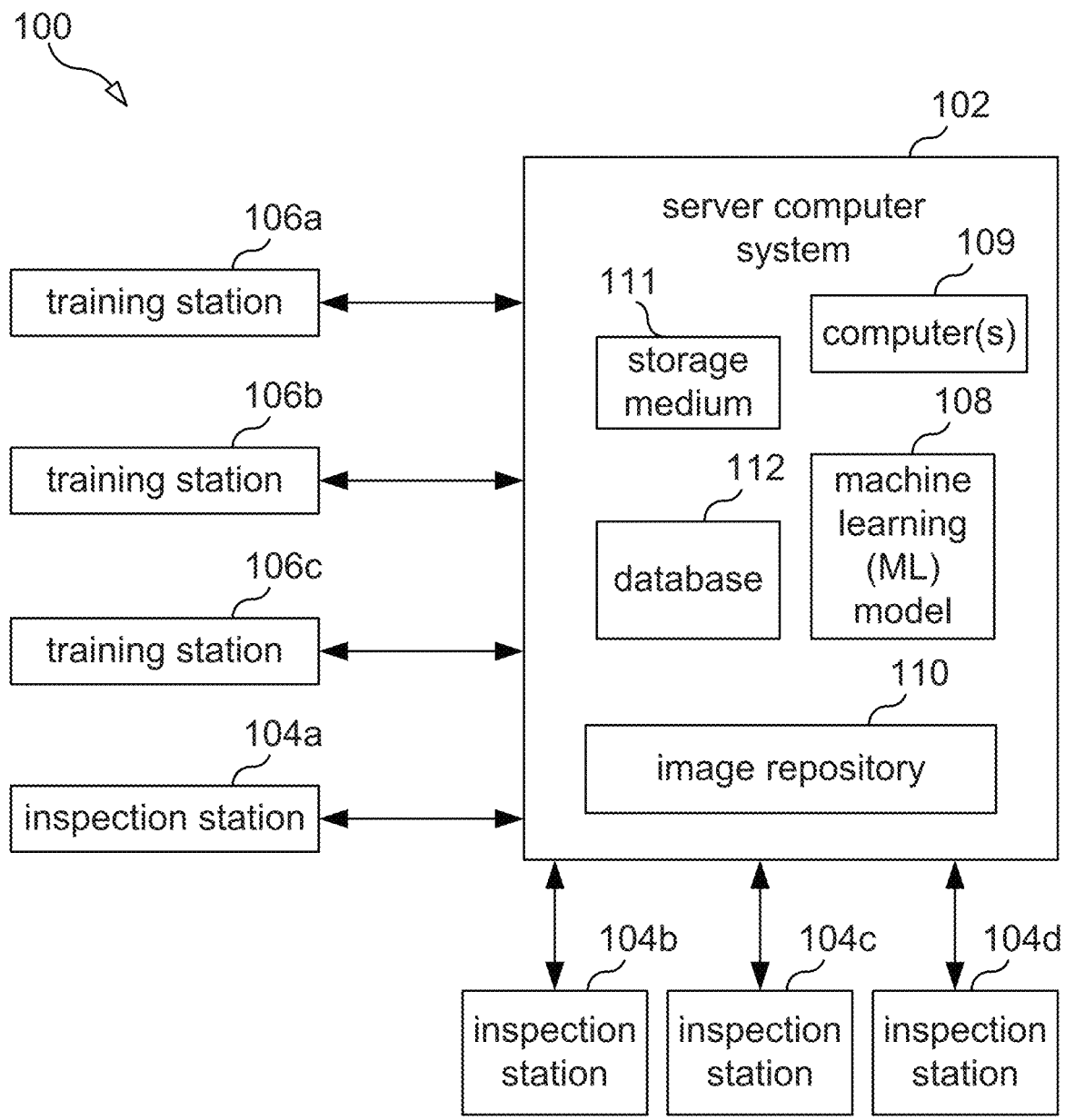
FIG. 1 is a block diagram of an inspection system according to some aspects.

FIG. 1 illustrates an inspection system 100 according to some aspects. In some aspects, as shown in FIG. 1, the inspection system 100 may include a server computer system 102 and one or more inspection stations 104 (e.g., inspection stations 104a-104d). In some aspects, the inspection system 100 may additionally or alternatively include one or more training stations 106 (e.g., training stations 106a-106d).

Figure 2A:
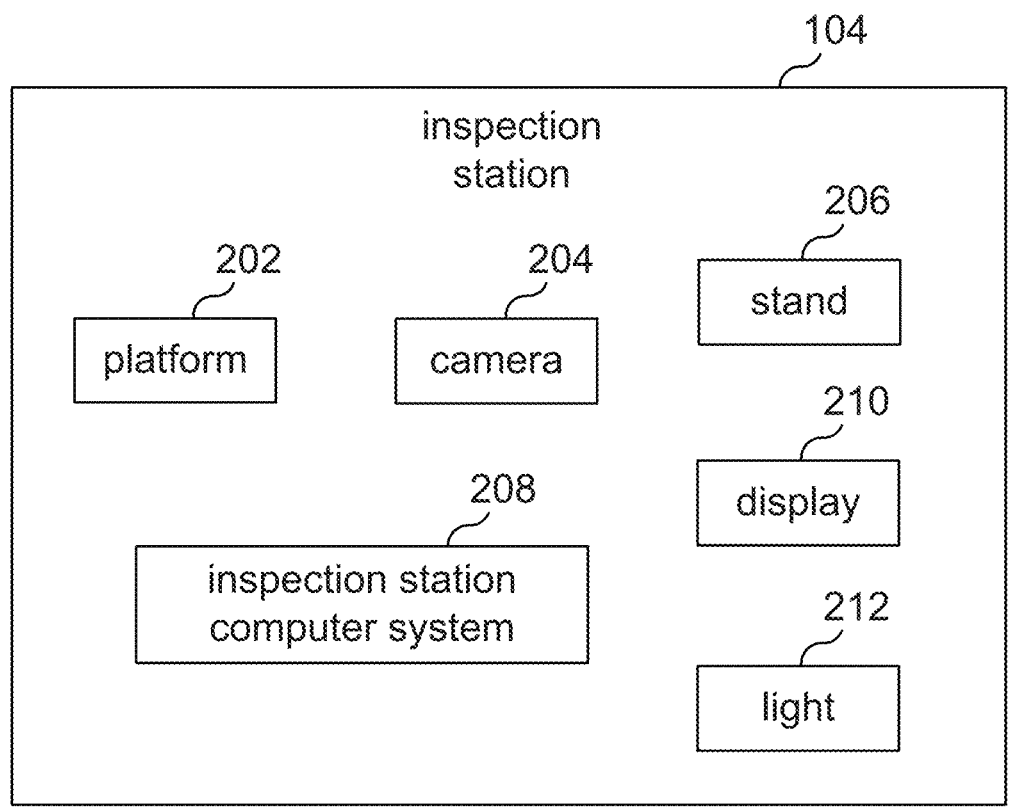
FIG. 2A is a block diagram of an inspection station of an inspection system according to some aspects.
Figure 2B:
FIG. 2B illustrates an inspection station of an inspection system according to some aspects.
Figure 2C:
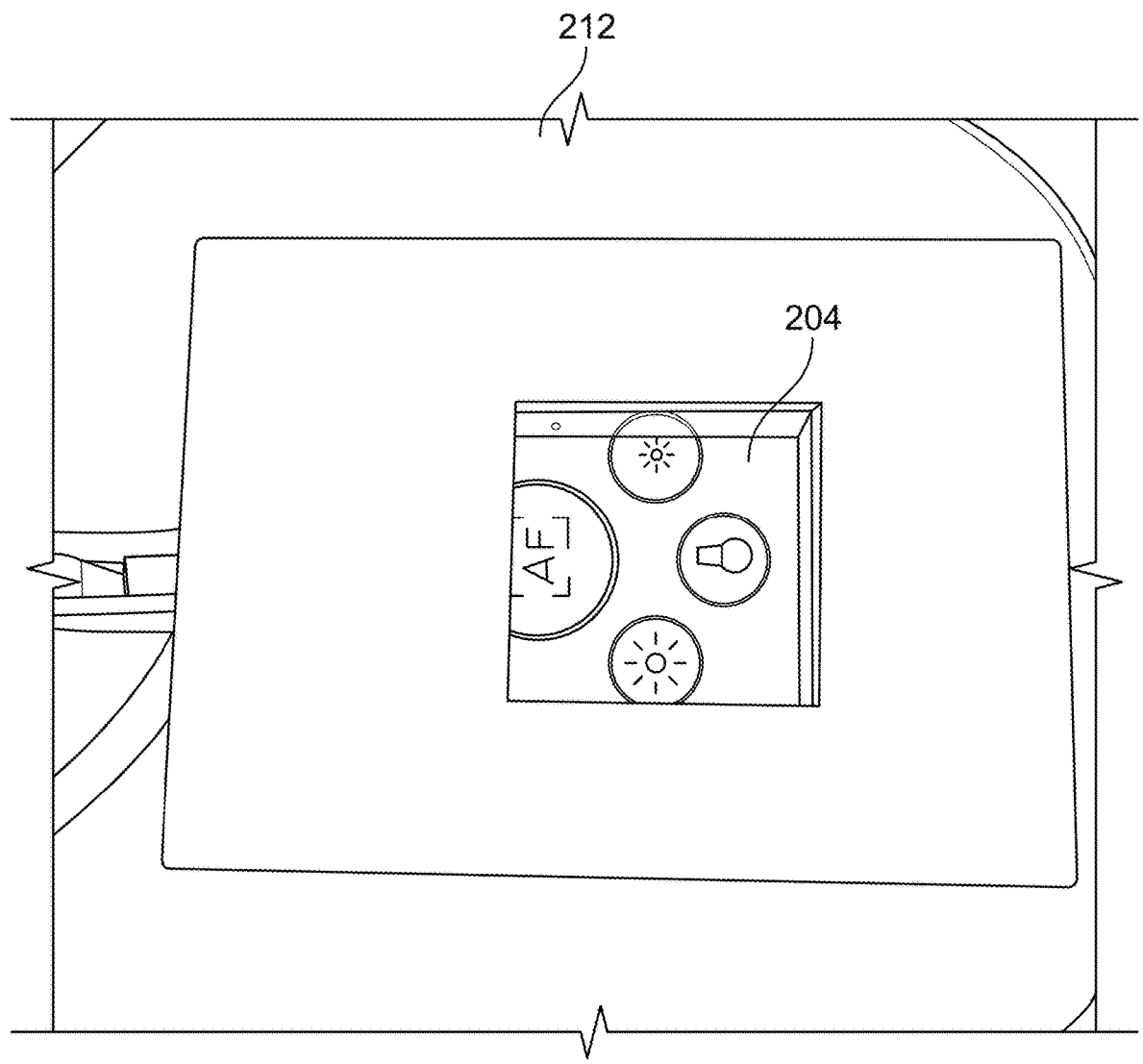
FIG. 2C illustrates a camera of an inspection station of an inspection system according to some aspects.

In some aspects, as shown in FIG. 2A, an inspection station 104 of the inspection system 100 may include a platform 202, a camera 204 (e.g., a document camera), a stand 206, an inspection station computer system 208, a display, 210, and/or a light 212. In some aspects, the stand 206 may be, for example and without limitation, a 3D-printed stand. In some aspects, as shown in FIGS. 2B and 2C, the stand 206 may be configured to position the camera 204 (e.g., above the platform 202). In some aspects, the stand 206 may be configured to hold the camera 204 at a fixed angle. In some aspects, the stand 206 may have an adjustable height. In some aspects, the stand 206 may be configured to position the light 212 (e.g., above the platform 202). In some aspects, the light 212 of the inspection station 104 may be a light emitting diode (LED) ring light (e.g., a Neewer 6-inch Desktop Mini USB Camera LED Ring Light). In some aspects, the platform 202 may include a canvas (e.g., a photo studio canvas). In some aspects, the canvas may have low glare and/or good light spread. In some aspects, the training station 104 may additionally or alternatively include a robot arm (e.g., an X arm robot). In some aspects, the robot arm may be configured to position a product 214 in a field of view of the camera 204. In some aspects, the inspection station computer system 208 may include an operating system (e.g., the Raspbian operating system).

In some aspects, the camera 204 may be configured to output a video stream. In some aspects, when a product 214 (e.g., a wire harness) is placed in a field of view of the camera 204, the camera 204 may be configured to output a video stream including captured product images of the product 214 in the field of view of the camera 204. In some aspects, the light 212 may be configured to illuminate the product 214 in the field of view of the camera 204. In some aspects, the inspection station computer system 208 of the inspection station 104 may be configured to receive the video stream output by the camera 204. In some aspects, the inspection station 104 (e.g., the inspection station computer system 208 of the inspection station 104) may be configured to convey a captured product image of the captured product images, and the server computer system 102 may be configured to receive the captured product image.

In some aspects, the inspection station 104 may also convey image metadata associated with the captured product image, and the server computer system 102 may be configured to receive the image metadata. In some aspects, the image metadata associated with the captured product image may include an inspection station identification (ID) of the inspection station 104 that captured and conveyed the captured product image, a product ID 216 of the product 214 in the field of view of the camera 204, an image ID of the captured product image, and/or a timestamp for the captured product image.

Figure 3:
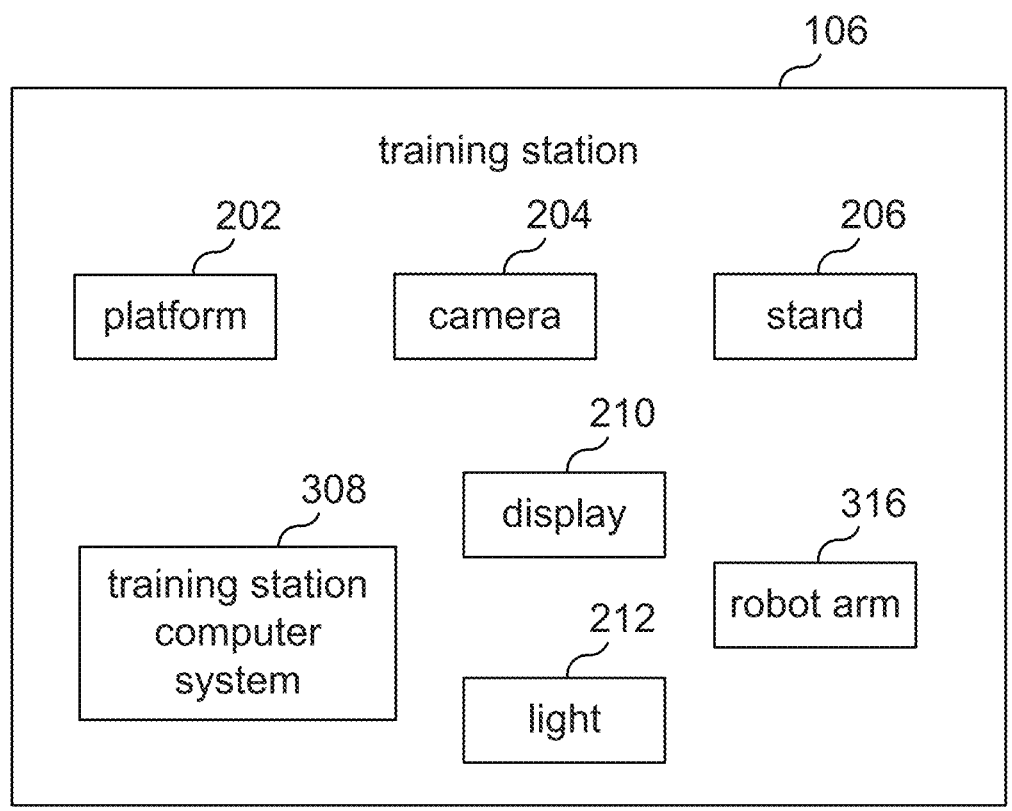
FIG. 3 is a block diagram of a training station of an inspection system according to some aspects.

In some aspects, as shown in FIG. 3, a training station 106 of the inspection system 100 may include a platform 202, a camera 204, a stand 206, a training station computer system 308, a display, 210, and/or a light 212. In some aspects, the training station 104 may additionally or alternatively include a robot arm 316. In some aspects, the robot arm 316 may be configured to position a product 214 in a field of view of the camera 204.

In some aspects, as shown in FIG. 1, the server computer system 102 may include a machine learning (ML) model 108, one or more computers 109, an image repository 110, a storage medium 111, and/or a database 112. In some aspects, the storage medium 111 may include a shared drive. In some aspects, the database 112 may be a key-value database (e.g., a Remote Dictionary Server (Redis) database). In some aspects, the ML model 108 may be configured to perform object detection (e.g., real-time object detection). In some aspects, the ML model 108 may include a neural network (e.g., a convolutional neural network). In some aspects, the neural network may have a deep learning framework. In some aspects, the ML model 108 may include the Darknet neural network framework with the You Only Look Once (YOLO) real-time objection detection system. However, this is not required, and, in some alternative aspects, the ML model 108 may include a different neural network framework (e.g., TensorFlow) and/or a different object detection system (e.g., R-CNN). In some aspects, the one or more computers 109 may be configured to communicate with and/or control the ML model 108, the image repository 110, the storage medium 111, and/or the database 112.

In some aspects, the ML model 108 may be configured to detect one or more objects in the captured product image and provide, for each of the detected one or more objects, an identification of a class of the detected object and an identification of a region of the detected object in the captured product image. In some aspects, the product 214 may include one or more product features, and the class of the detected object may be either an acceptable product feature class or an unacceptable product feature class. In some aspects, in detecting the one or more objects, the ML model 108 may be configured to (i) for each class of a set of classes, determine a probability that the captured product image includes an object of the class in a region of the captured product image, and (ii) for each determined probability that exceeds a probability threshold, determine that the region of the captured product image includes the object of the class. In some aspects, the probability threshold may be, for example and without limitation, in a range greater than or equal to 0.20 and less than or equal to 0.75. In some aspects, the probability threshold may be, for example and without limitation, 0.20, 0.25, 0.30, 0.35, 0.40, 0.45, 0.50, 0.55, 0.60, or 0.70.

In some aspects, the product 214 may include one or more product features. In some aspects, the product 214 may be, for example and without limitation, a wire harness. In some aspects, the wire harness may include one or more connectors. In some aspects, the one or more connectors may include one or more welded connectors (e.g., one or more Koastal (KSTL) connectors). In some aspects, the one or more connectors may additionally or alternatively include one or more crimp connectors (e.g., one or more Rosenberger (RSBRG) connectors, one or more lug connectors, and/or one or more Amphenol connectors). In some aspects, the product features of the wire harness may include endcap placement, a tie wrap, sleeve placement, a crimp, jacket placement, lug placement, heated heat shrink, welding, and/or a shield braid. In some aspects, the set of classes may include an acceptable endcap placement class, an unacceptable endcap placement class, an acceptable tie wrap class, an unacceptable tie wrap class, an acceptable sleeve placement class, an unacceptable sleeve placement class, an acceptable crimp class, an unacceptable crimp class, an acceptable jacket placement class, an unacceptable jacket placement class, an acceptable placed lugs class, an unacceptable placed lugs class, an acceptable heated heat shrink class, an unacceptable heated heat shrink class, an acceptable weld class, an unacceptable weld class, an acceptable shield braid class, and/or an unacceptable shield braid class.

Figure 4A:
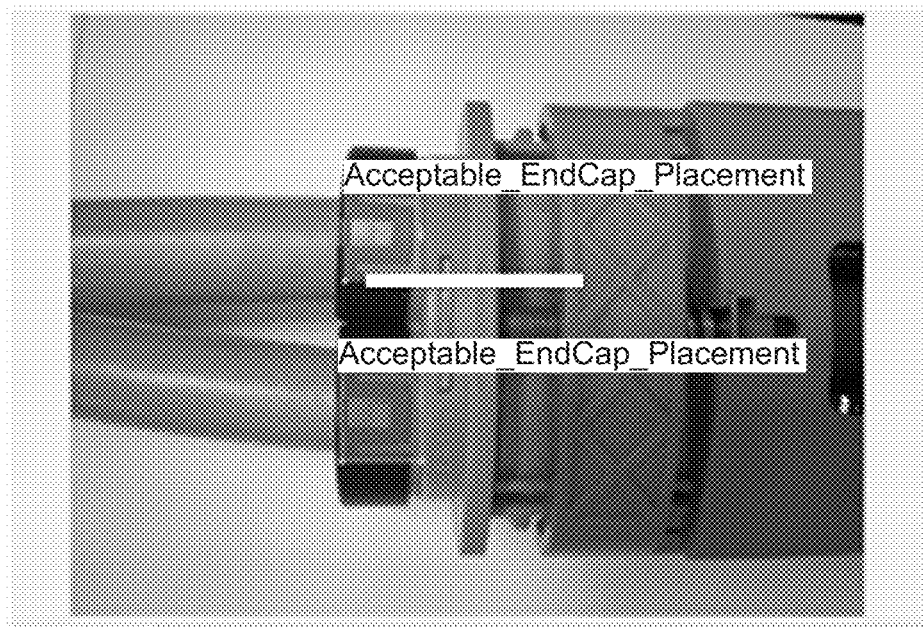
FIG. 4A-4VV illustrate classes of objects that a machine learning (ML) model of a server computer system of an inspection system may be configured to detect according to some aspects.
Figure 4B:
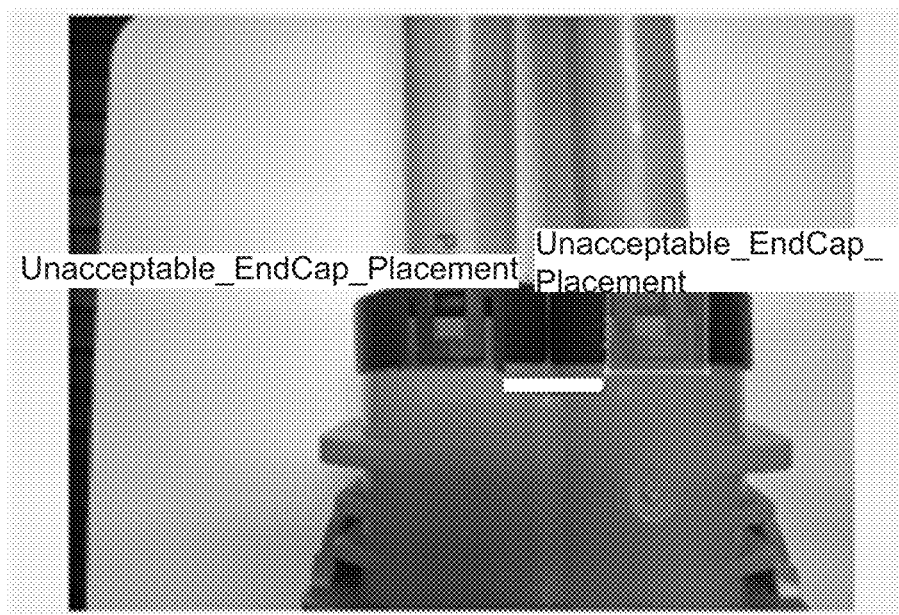
Figure 4C:
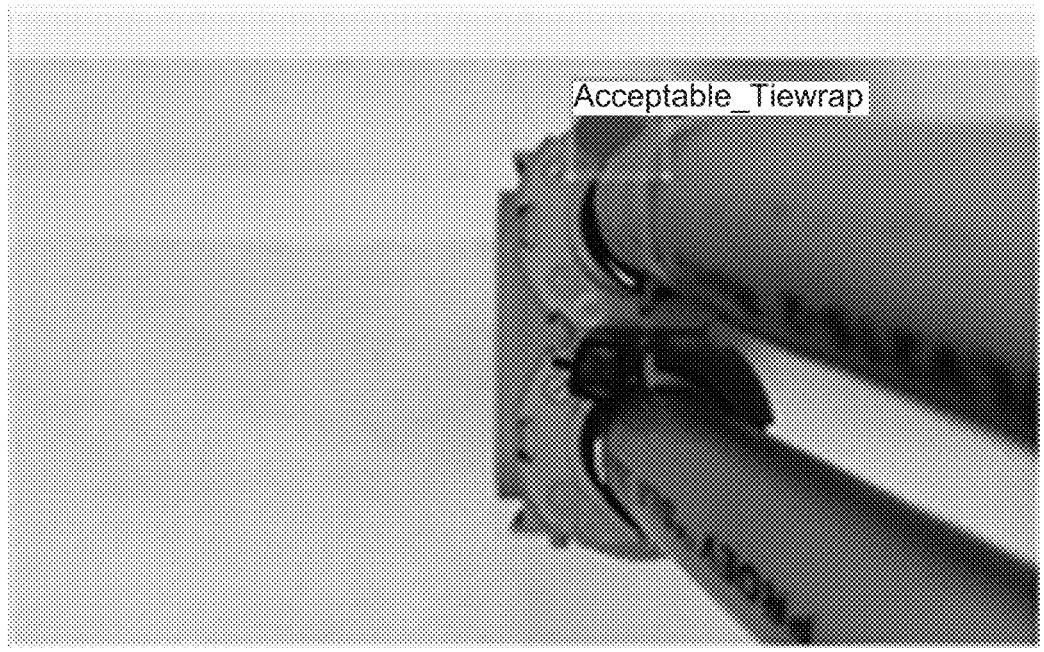
Figure 4D:
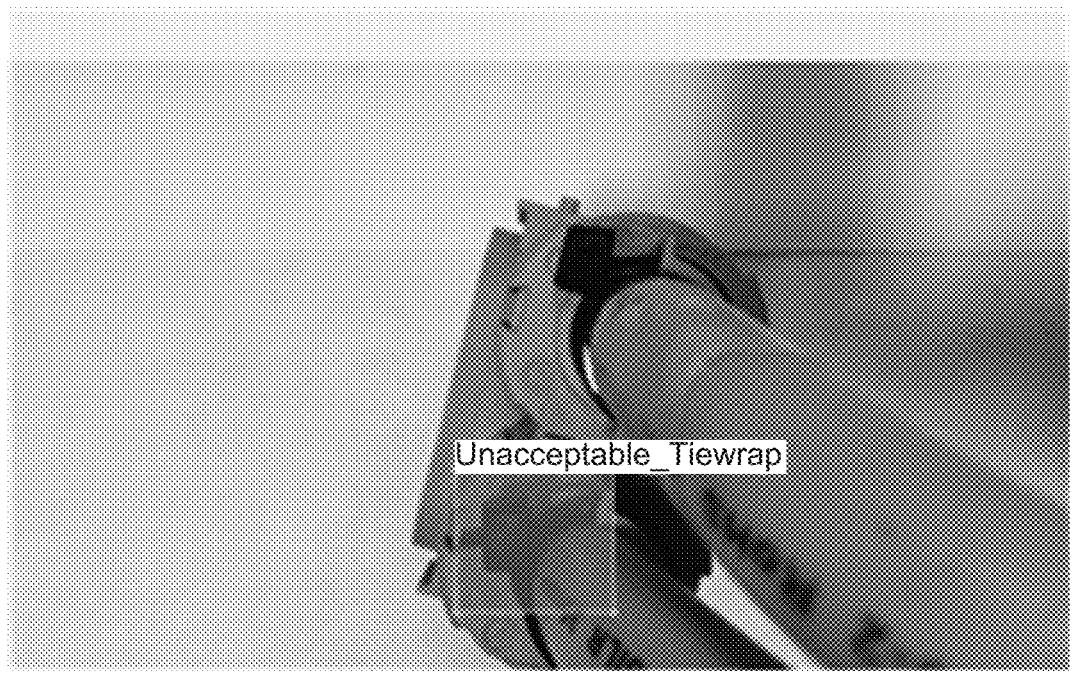
Figure 4E:
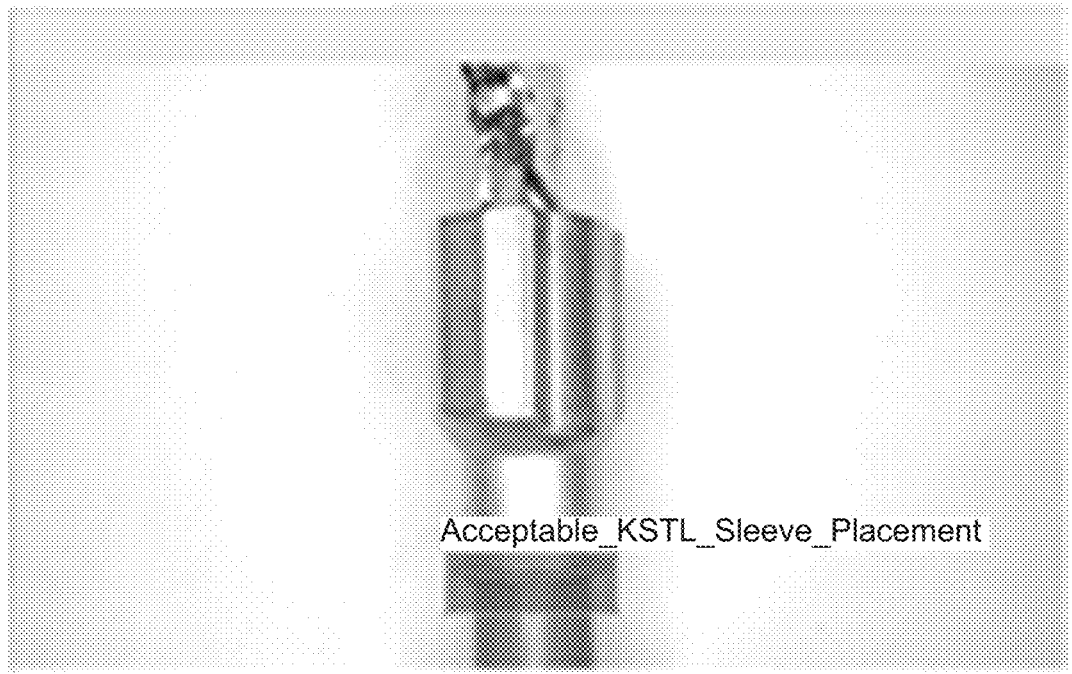
Figure 4F:
Figure 4G:
Figure 4H:
Figure 4I:
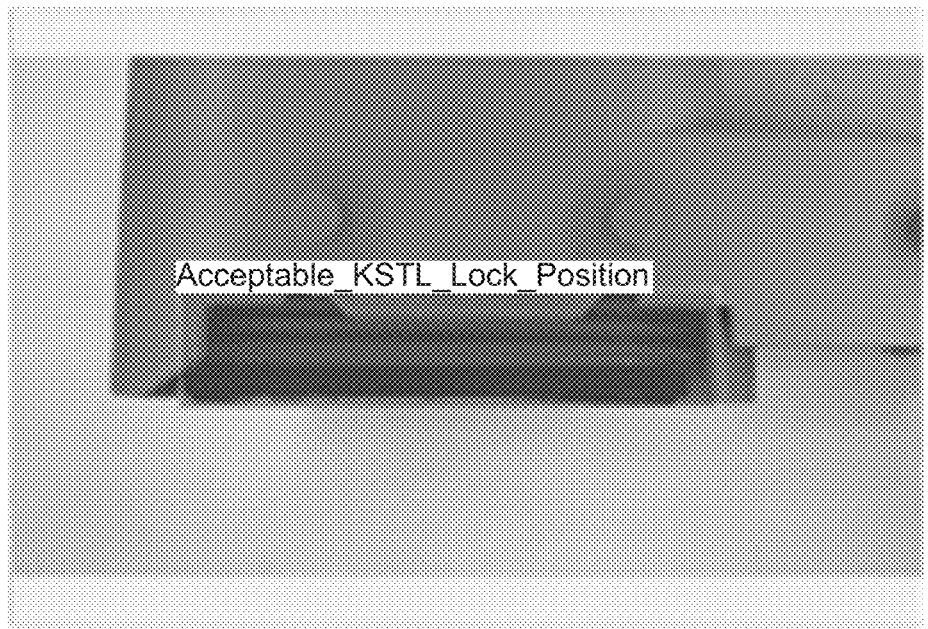
Figure 4J:
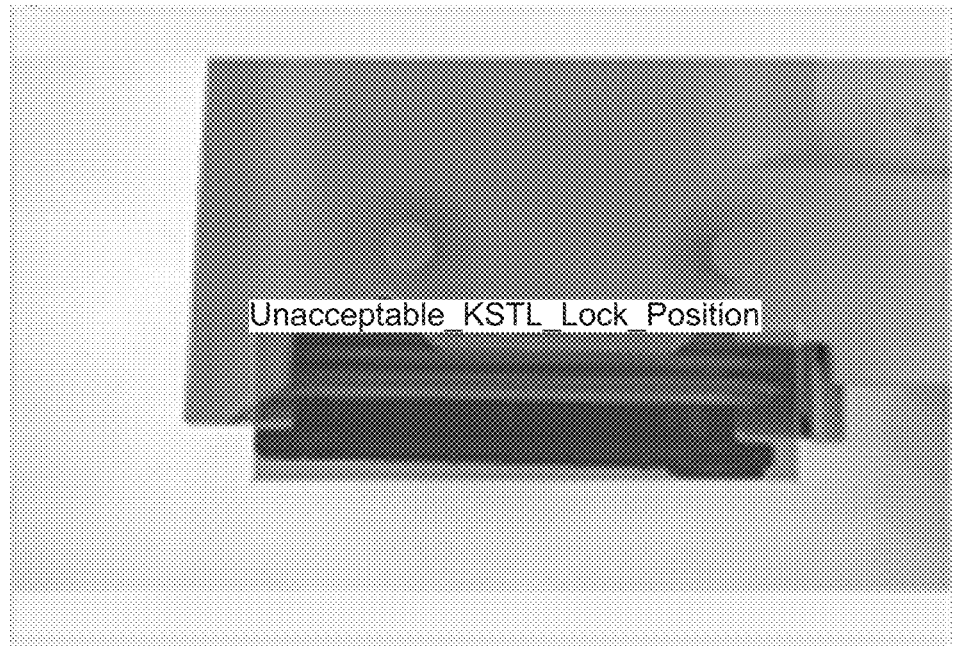

In some aspects, the set of classes may include an acceptable endcap placement class and an unacceptable endcap placement class, examples of which are illustrated in FIGS. 4A and 4B, respectively. In some aspects, the set of classes may additionally or alternatively include an acceptable tie wrap class and an unacceptable tie wrap class, examples of which are illustrated in FIGS. 4C and 4D, respectively. In some aspects, the set of classes may additionally or alternatively include an acceptable KSTL sleeve placement class and an unacceptable KSTL sleeve placement class, examples of which are illustrated in FIGS. 4E and 4F, respectively. In some aspects, the set of classes may additionally or alternatively include an acceptable KSTL distance sleeve orientation class and an unacceptable KSTL distance sleeve orientation class, examples of which are illustrated in FIGS. 4G and 4H, respectively. In some aspects, the set of classes may additionally or alternatively include an acceptable KSTL lock position class and an unacceptable KSTL lock position class, examples of which are illustrated in FIGS. 4I and 4J, respectively.

Figure 4K:
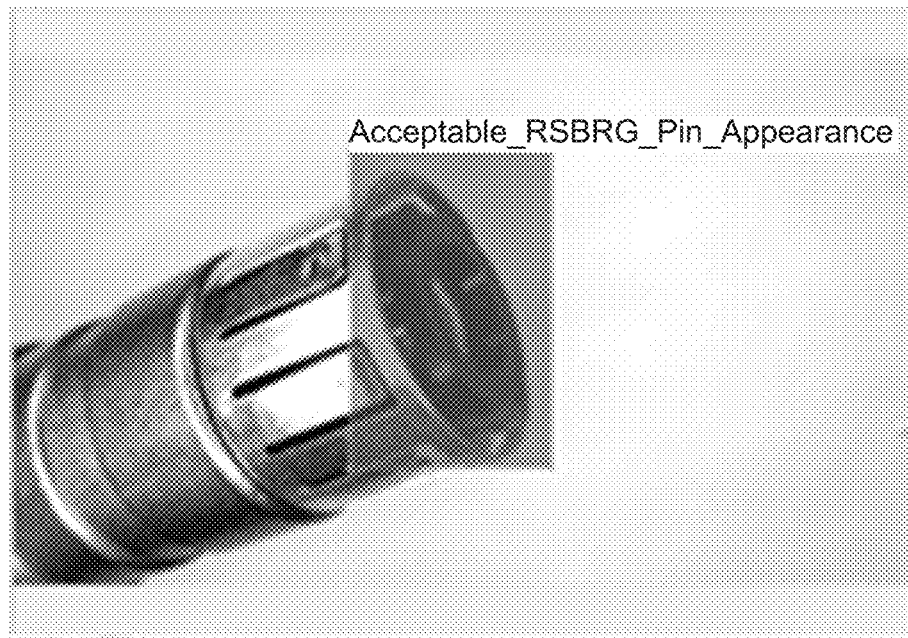
Figure 4L:
Figure 4M:
Figure 4N:
Figure 4O:
Figure 4P:
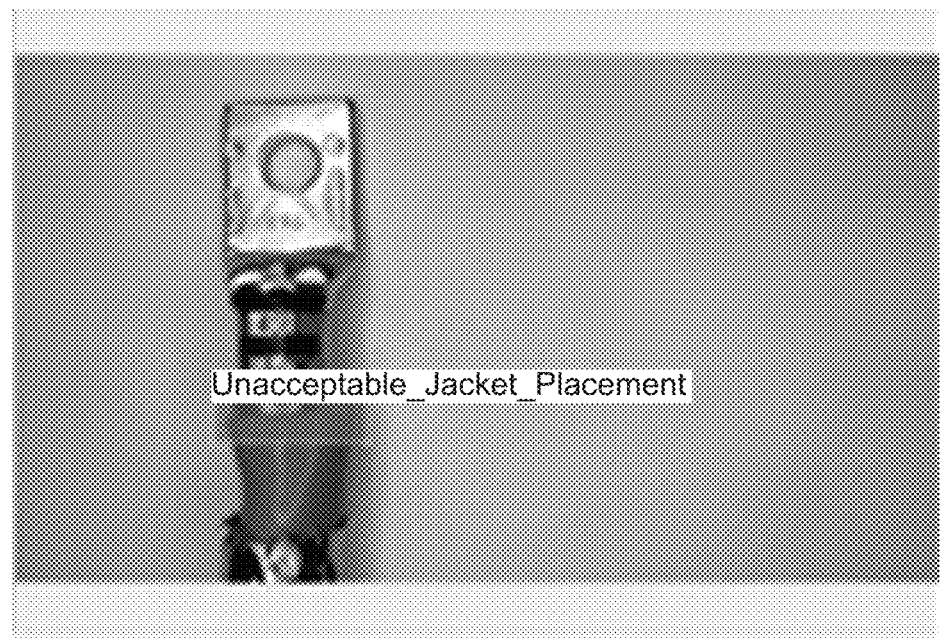
Figure 4Q:
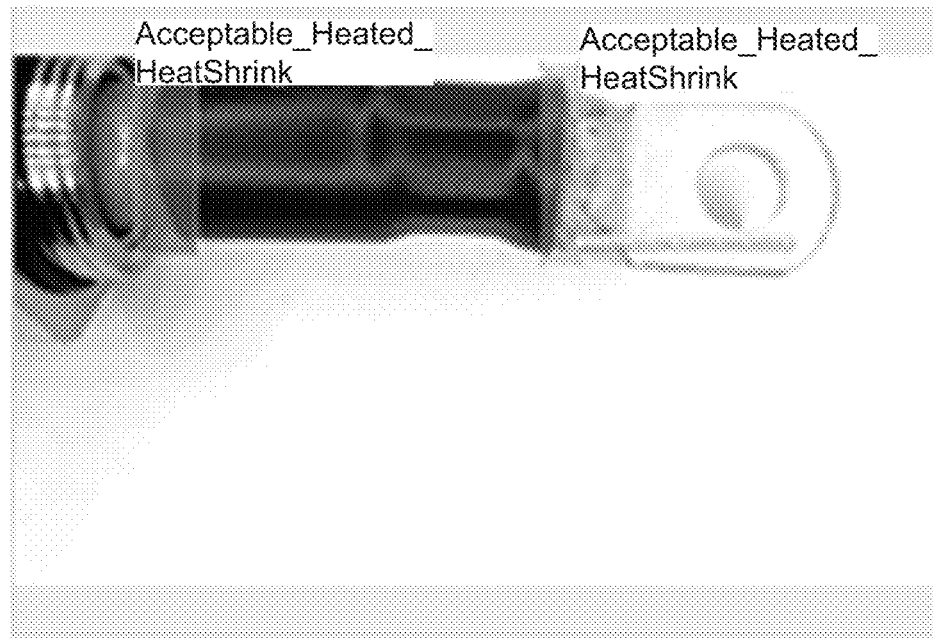
Figure 4R:
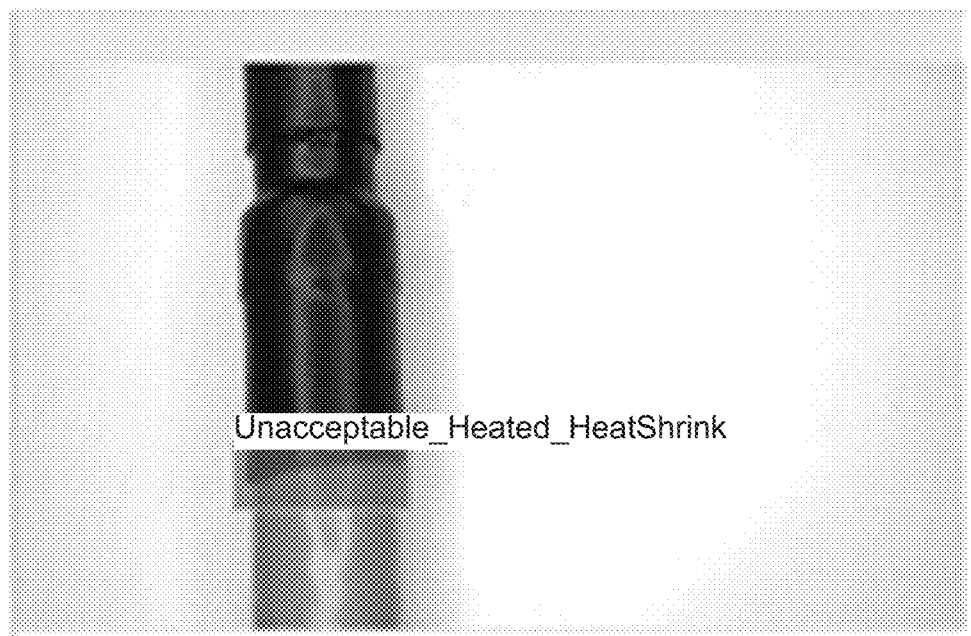
Figure 4S:
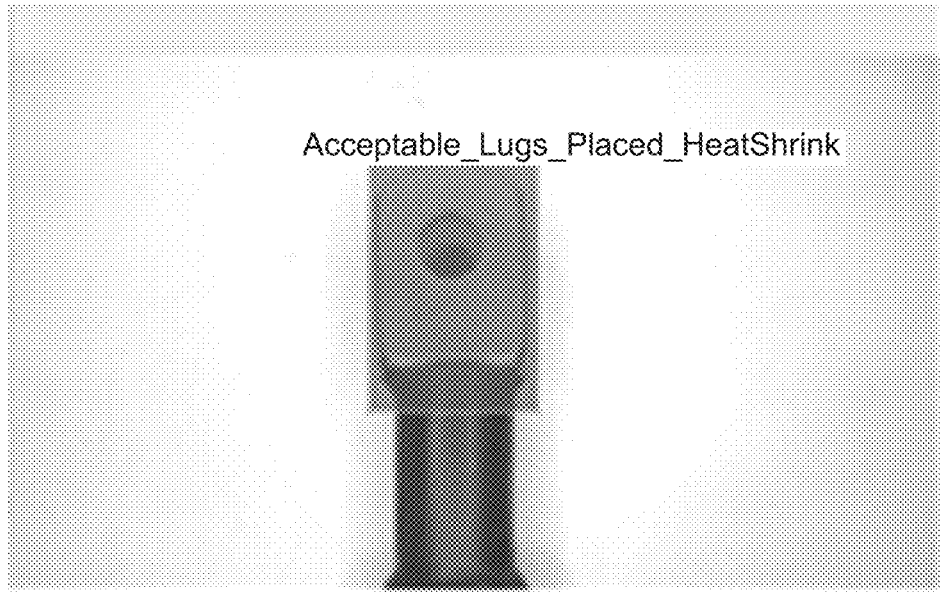
Figure 4T:

In some aspects, the set of classes may additionally or alternatively include an acceptable RSBRG pin appearance class and an unacceptable RSBRG pin appearance class, examples of which are illustrated in FIGS. 4K and 4L, respectively. In some aspects, the set of classes may additionally or alternatively include an acceptable RSBRG crimp class and an unacceptable RSBRG crimp class, examples of which are illustrated in FIGS. 4M and 4N, respectively. In some aspects, the set of classes may additionally or alternatively include an acceptable jacket placement class and an unacceptable jacket placement class, examples of which are illustrated in FIGS. 4O and 4P, respectively. In some aspects, the set of classes may additionally or alternatively include an acceptable placed lug class and an unacceptable placed lug class. In some aspects, the set of classes may additionally or alternatively include an acceptable heated heat shrink class and an unacceptable heated heat shrink class, examples of which are illustrated in FIGS. 4Q and 4R, respectively. In some aspects, the set of classes may additionally or alternatively include an acceptable lugs placed heat shrink class and an unacceptable lugs placed heat shrink class, examples of which are illustrated in FIGS. 4S and 4T, respectively.

Figure 4U:
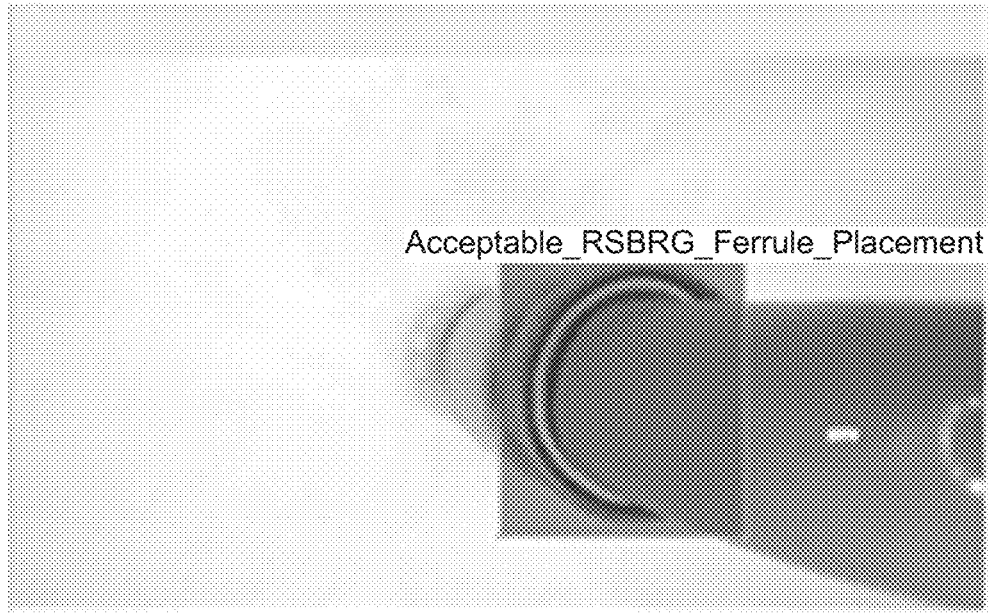
Figure 4V:
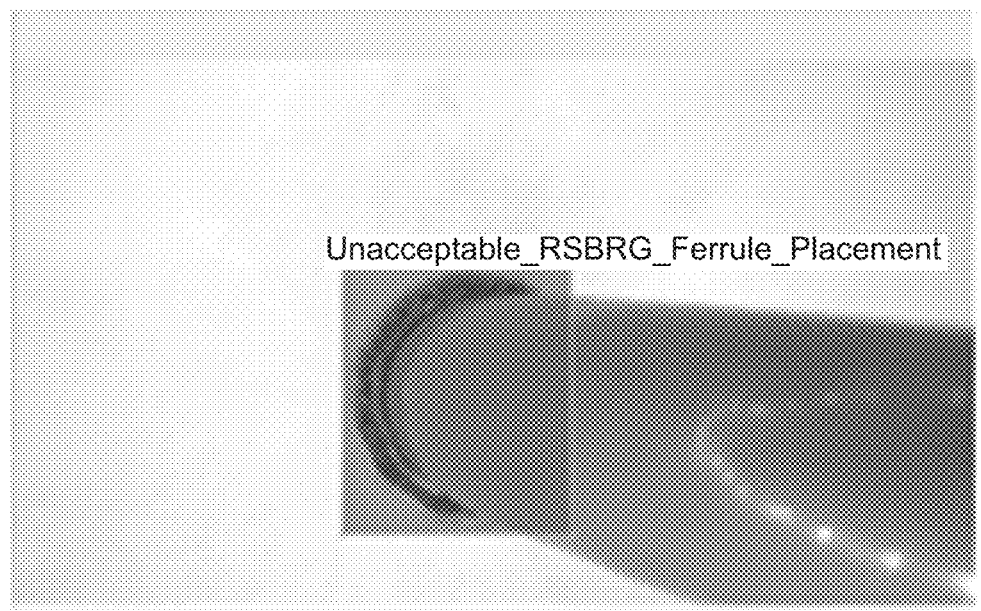
Figure 4W:
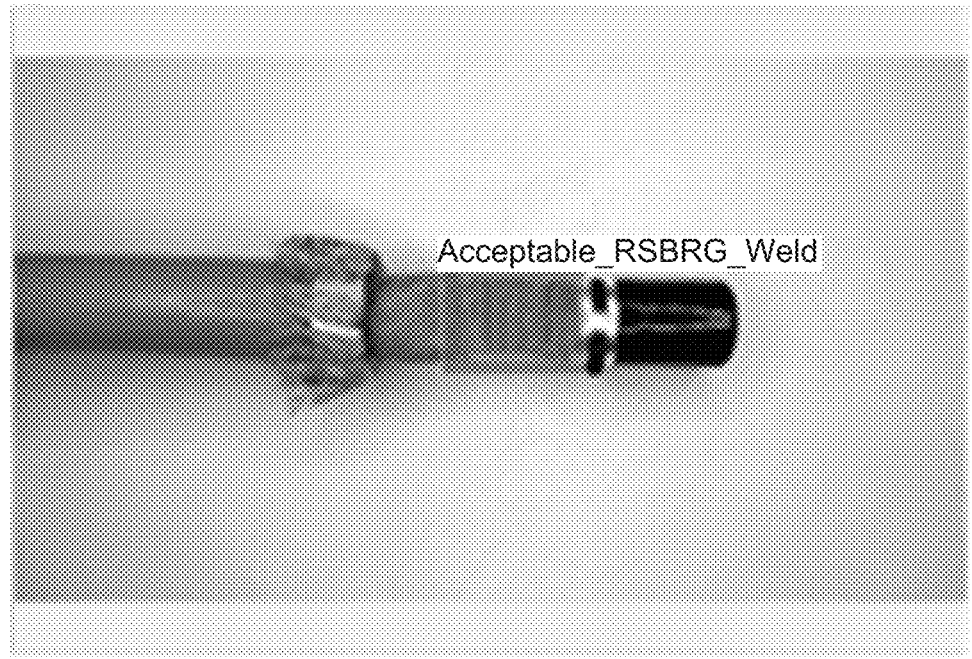
Figure 4X:
Figure 4Y:
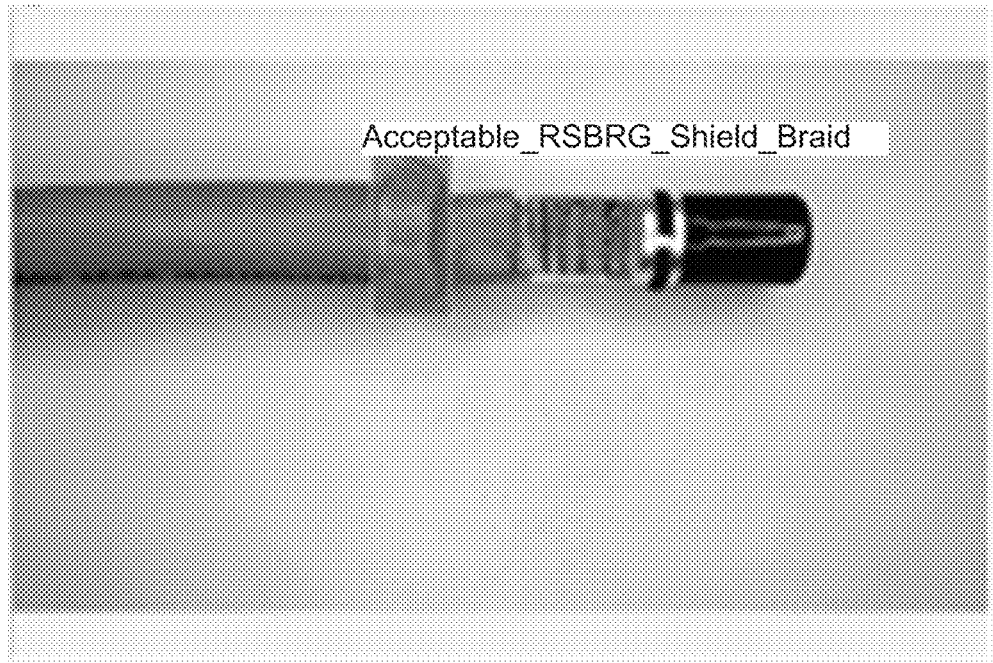
Figure 4Z:
Figure 4A:
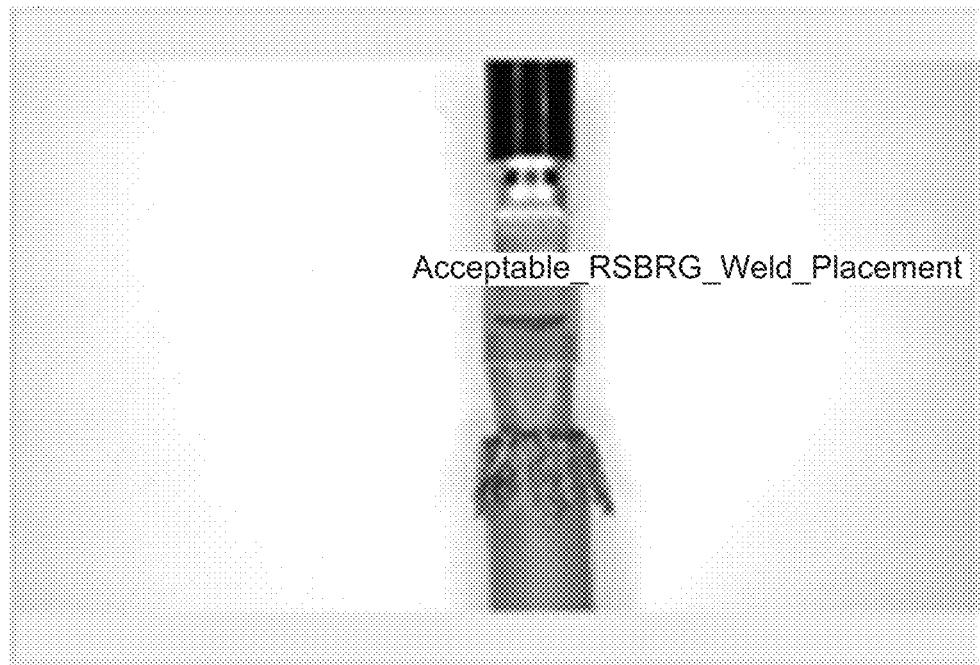
Figure 4B:
Figure 4C:
Figure 4D:
Figure 4E:
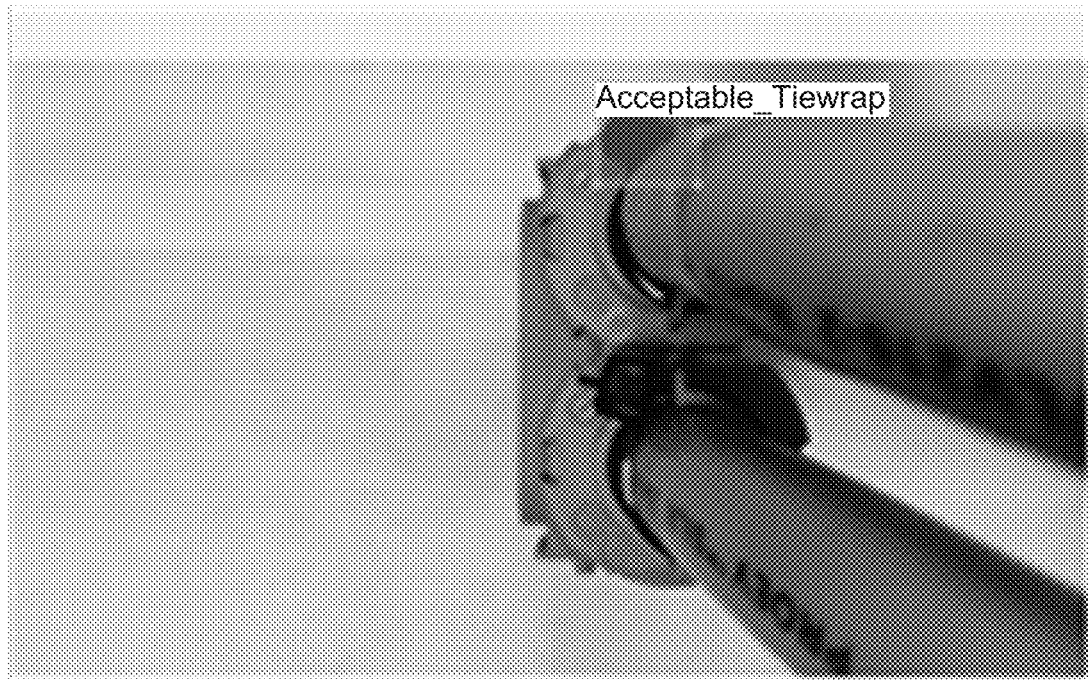
Figure 4F:
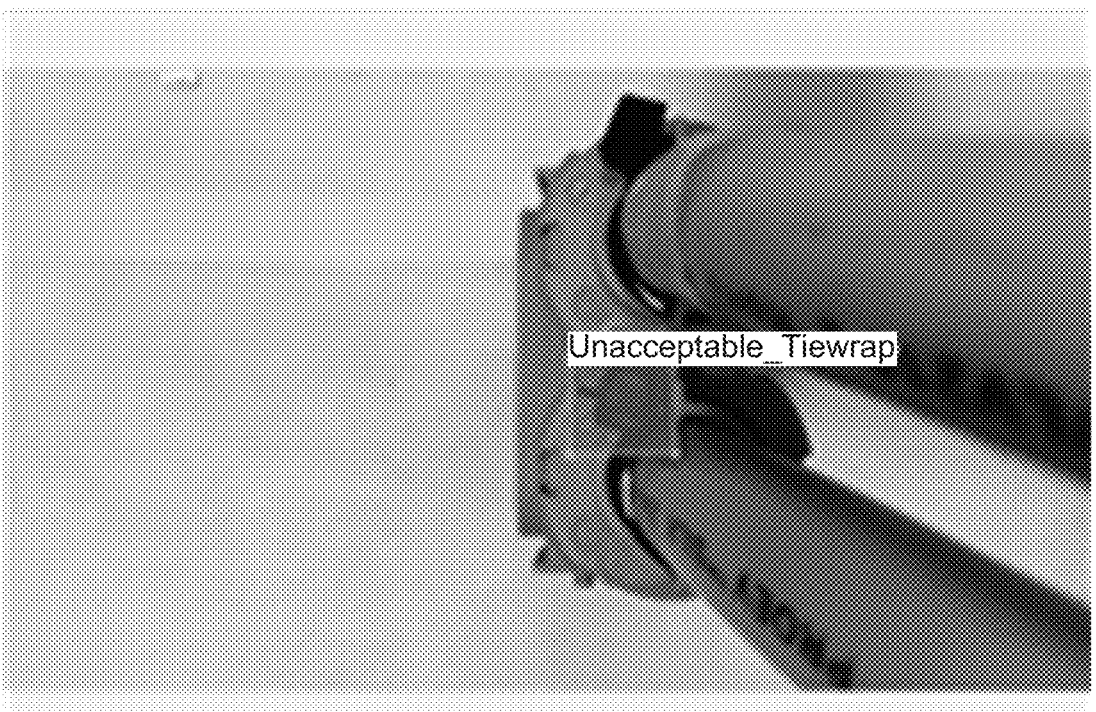
Figure 4G:
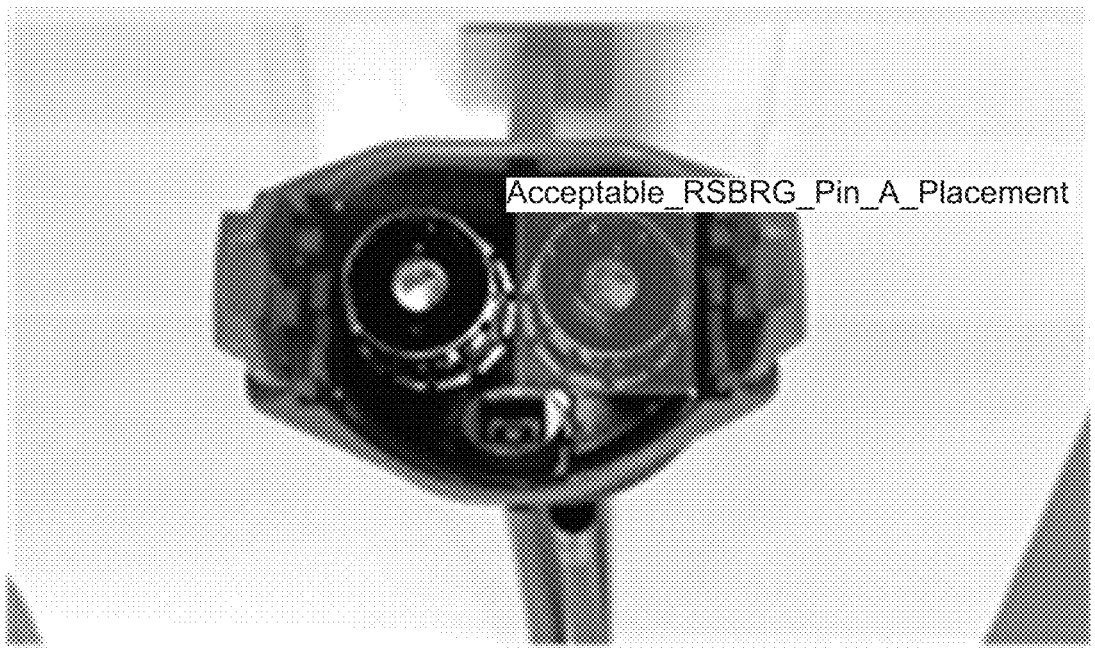
Figure 4H:
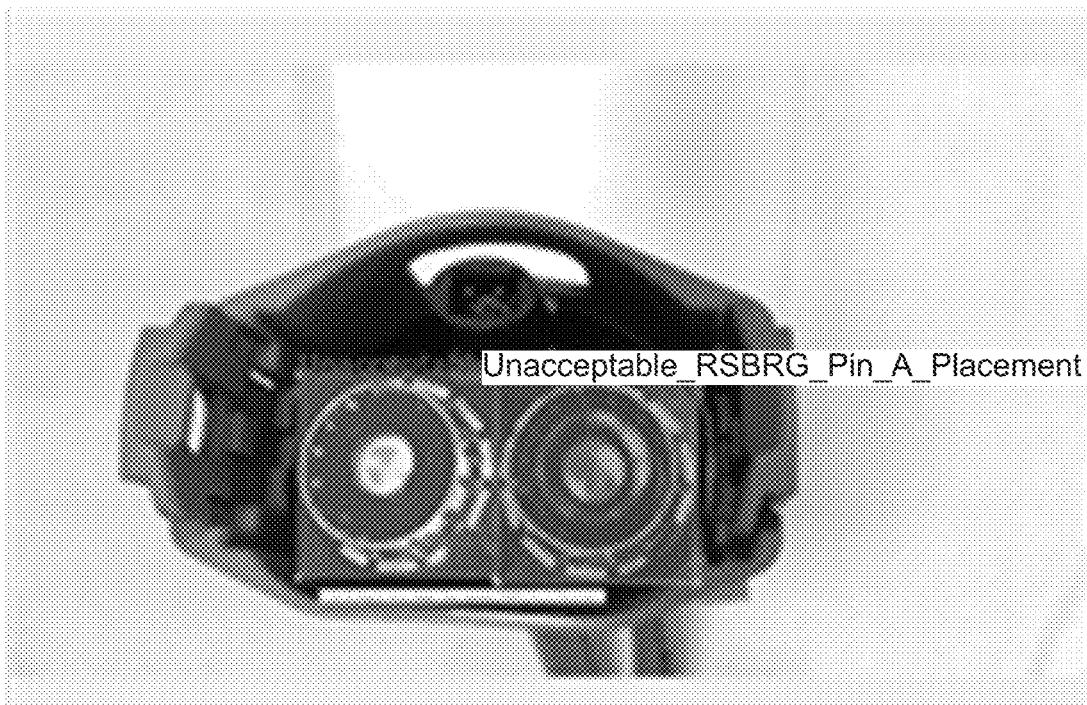
Figure 4I:
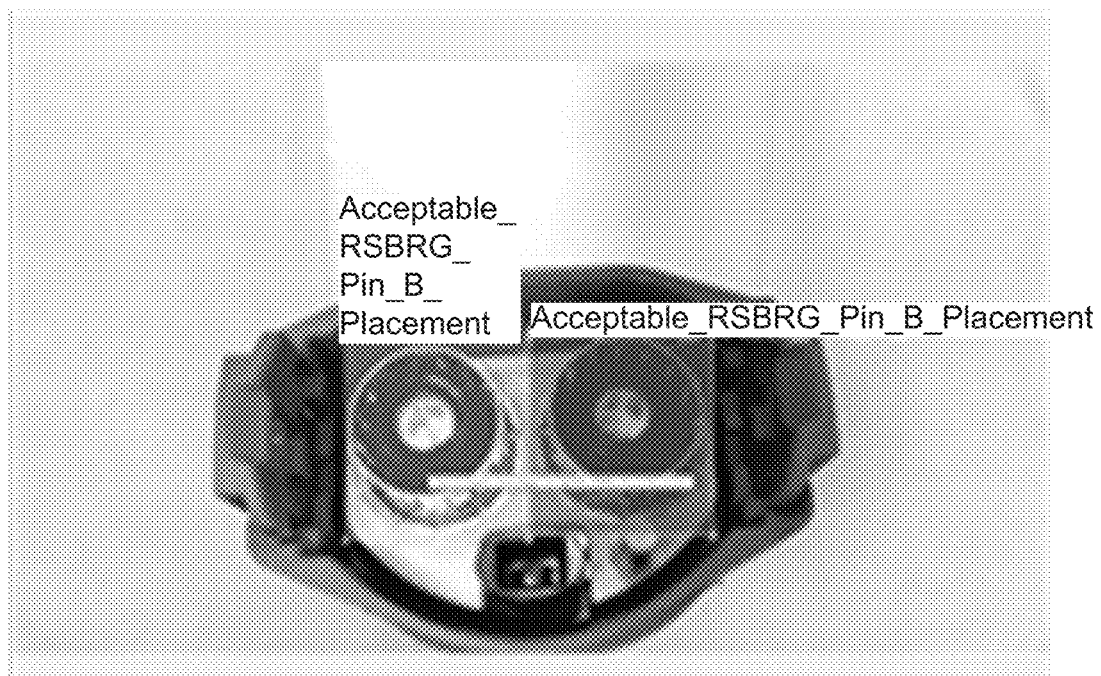
Figure 4J:
Figure 4K:
Figure 4L:
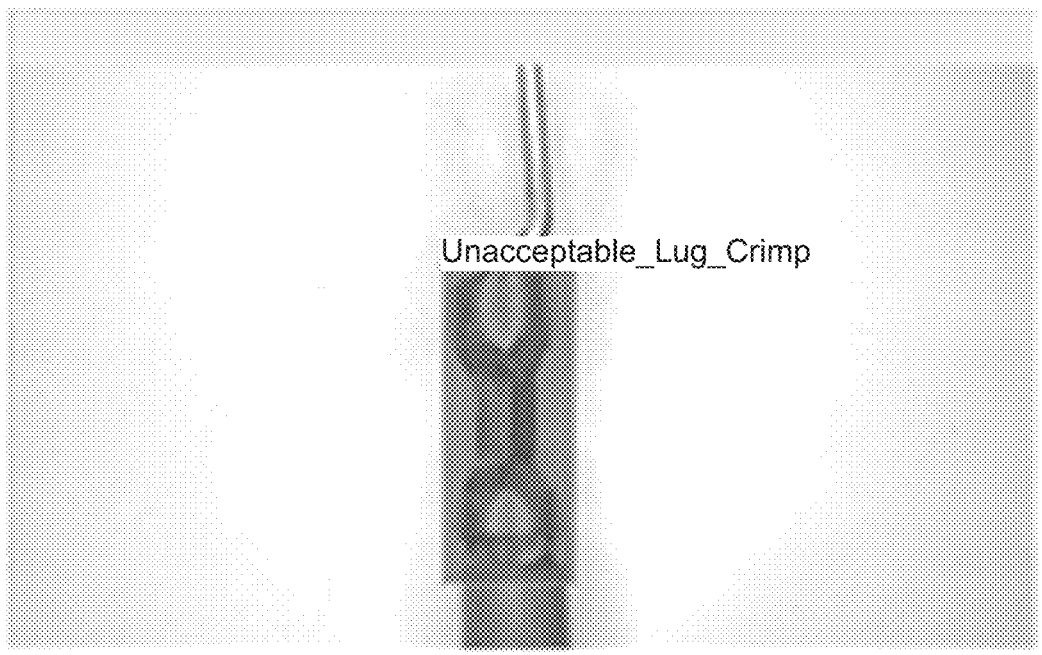
Figure 4M:
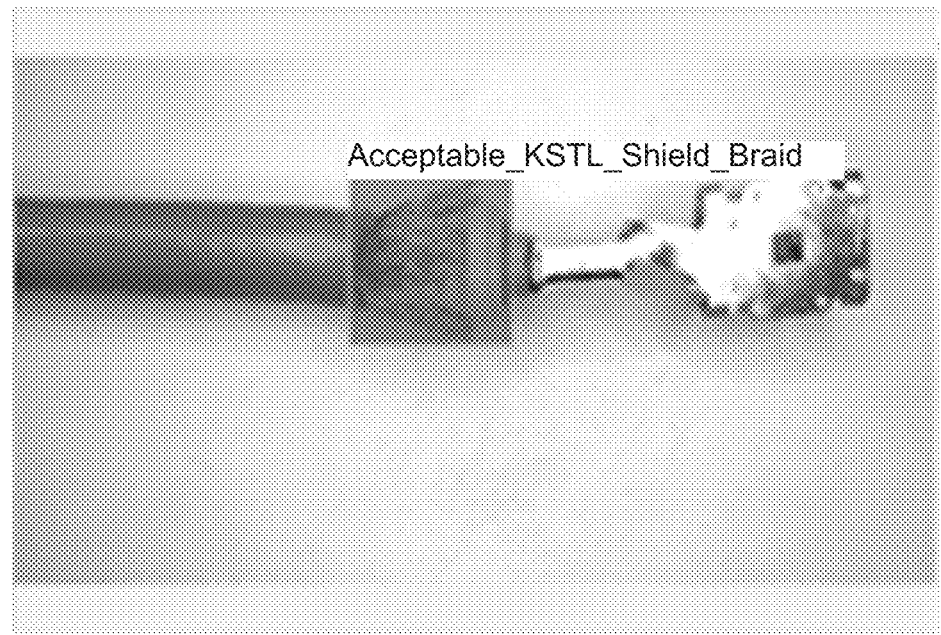
Figure 4N:
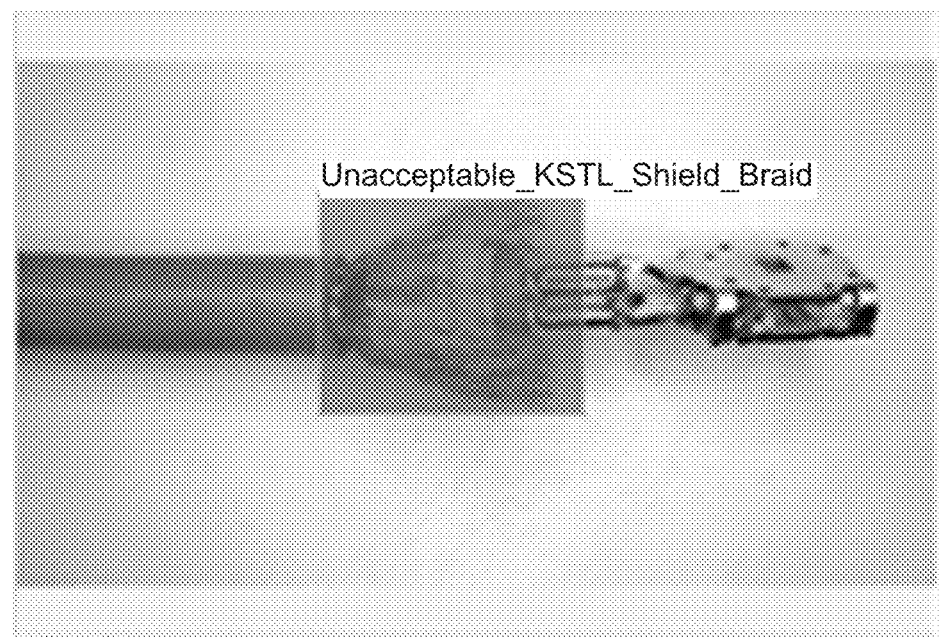
Figure 4O:
Figure 4P:
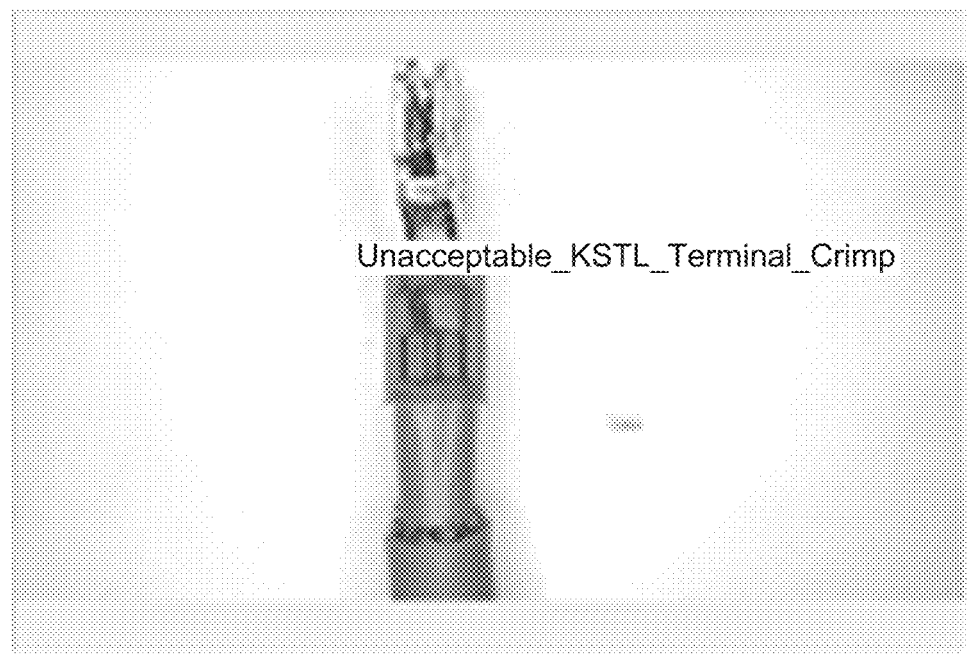
Figure 4Q:
Figure 4R:
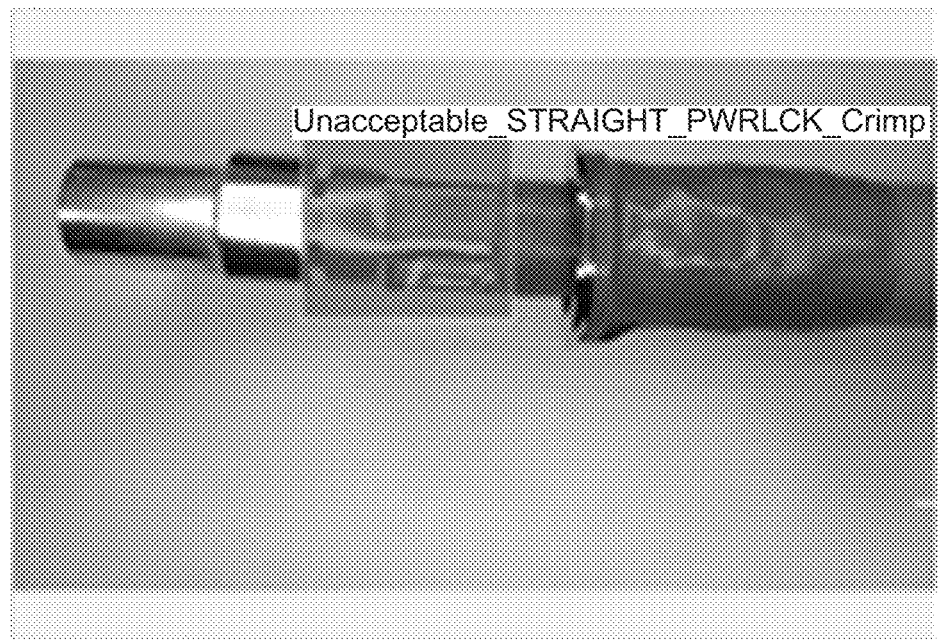
Figure 4S:
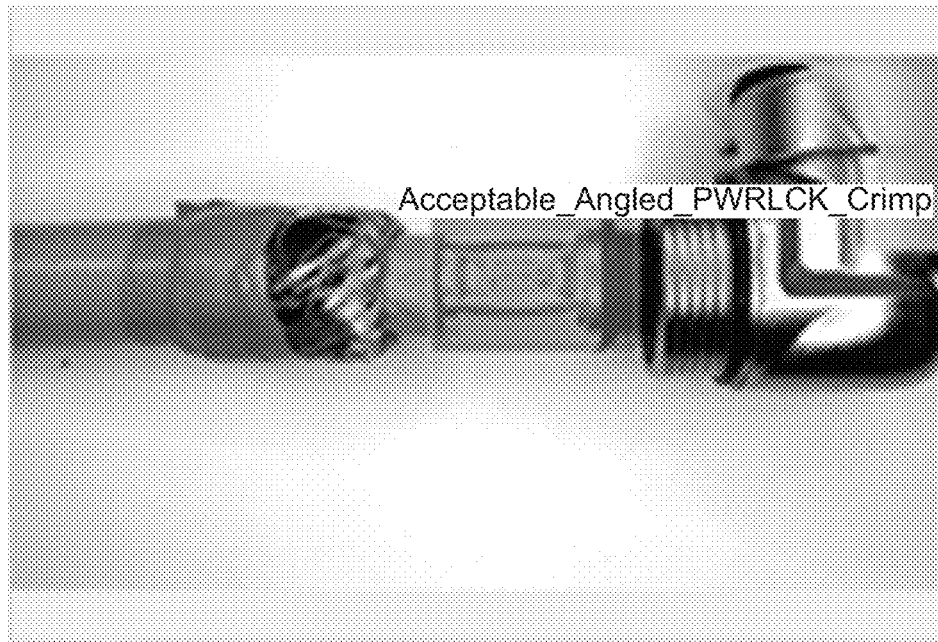
Figure 4T:
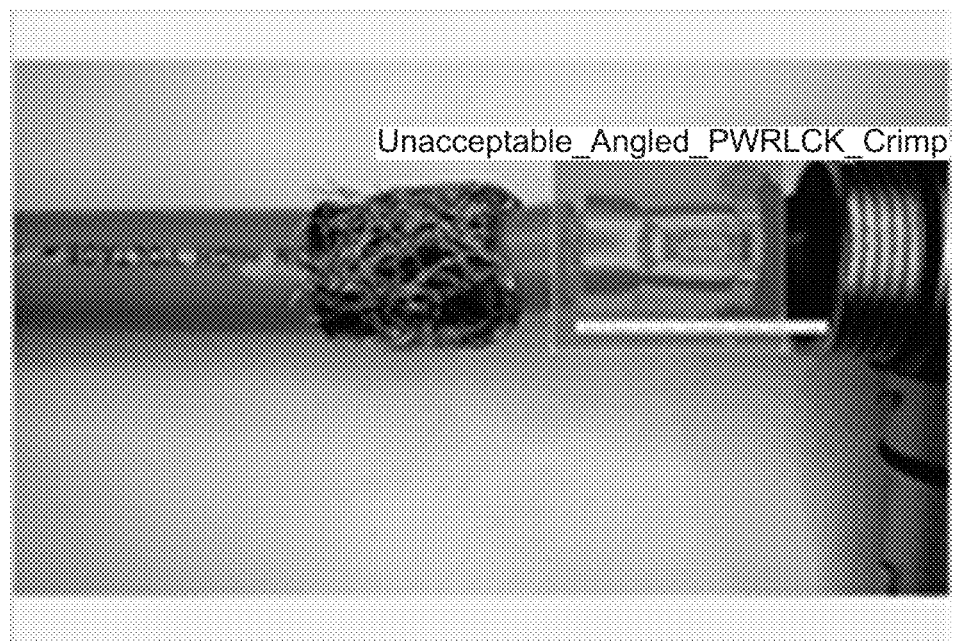
Figure 4U:
Figure 4V:

In some aspects, the set of classes may additionally or alternatively include an acceptable RSBRG ferrule placement class and an unacceptable RSBRG ferrule placement class, examples of which are illustrated in FIGS. 4U and 4V, respectively. In some aspects, the set of classes may additionally or alternatively include an acceptable RSBRG weld class and an unacceptable RSBRG weld class, examples of which are illustrated in FIGS. 4W and 4X, respectively. In some aspects, the set of classes may additionally or alternatively include an acceptable RSBRG shield braid class and an unacceptable RSBRG shield braid class, examples of which are illustrated in FIGS. 4Y and 4Z, respectively. In some aspects, the set of classes may additionally or alternatively include an acceptable RSBRG weld placement class and an unacceptable RSBRG weld placement class, examples of which are illustrated in FIGS. 4AA and 4BB, respectively. In some aspects, the set of classes may additionally or alternatively include an acceptable detached RSBRG shield conductor class and an unacceptable detached RSBRG shield conductor class, examples of which are illustrated in FIGS. 4CC and 4DD, respectively.

In some aspects, the set of classes may additionally or alternatively include an acceptable KSTL tiewrap cut class and an unacceptable KSTL tiewrap cut class, examples of which are illustrated in FIGS. 4EE and 4FF, respectively. In some aspects, the set of classes may additionally or alternatively include an acceptable RSBRG pin A placement class and an unacceptable RSBRG pin A placement class, examples of which are illustrated in FIGS. 4GG and 4HH, respectively. In some aspects, the set of classes may include an acceptable RSBRG pin B placement class and an unacceptable RSBRG pin B placement class, examples of which are illustrated in FIGS. 4II and 4JJ, respectively. In some aspects, the set of classes may additionally or alternatively include an acceptable lug crimp class and an unacceptable lug crimp class, examples of which are illustrated in FIGS. 4KK and 4LL, respectively. In some aspects, the set of classes may additionally or alternatively include an acceptable KSTL braid condition class and an unacceptable acceptable KSTL braid condition class, examples of which are illustrated in FIGS. 4MM and 4NN, respectively. In some aspects, the set of classes may additionally or alternatively include an acceptable KSTL terminal crimp class and an unacceptable KSTL terminal crimp class, examples of which are illustrated in FIGS. 4OO and 4PP, respectively. In some aspects, the set of classes may additionally or alternatively include an acceptable straight Powerlock crimp class and an unacceptable straight Powerlock crimp class, examples of which are illustrated in FIGS. 4QQ and 4RR, respectively. In some aspects, the set of classes may additionally or alternatively include an acceptable angled Powerlock crimp class and an unacceptable angled Powerlock crimp class, examples of which are illustrated in FIGS. 4SS and 4TT, respectively. In some aspects, the set of classes may additionally or alternatively include an acceptable black (BLK) lugs crimp class and an unacceptable BLK lugs crimp class, examples of which are illustrated in FIGS. 4UU and 4VV, respectively.

In some aspects, the server computer system 102 may store the captured product image in the image repository 110. In some aspects, the captured product image may be stored in the image repository 110 as a Base64 encoded image. In some aspects, the server computer system 102 may store the captured product image in the image repository 110 with metadata associated with the captured product image. In some aspects, the metadata associated with the captured product image may include image metadata and label metadata. In some aspects, the image metadata associated with the captured product image may include an inspection station ID of the inspection station 104 that captured and conveyed the captured product image, a product ID 216 of the product 214, an image ID of the captured product image, and/or a timestamp for the captured product image. In some aspects, the image metadata may have been conveyed by an inspection station 104 and received by the server computer system 102. In some aspects, the label metadata may include, for each of the one or more objects detected in the captured product image by the ML model 108, the identification of the class of the detected object, the identification of the region of the detected object in the captured product image, and/or the determined probability that the captured product image includes the object of the class in the region of the captured product image.

In some aspects (e.g., some aspects in which the database 112 is a Redis database (Redis DB)), the server computer system 102 may include a fetch service (e.g., Redis fetch service) that scans the database 112 for new keys. In some aspects, if no new keys are found, the fetch service may sleep. In some aspects, if the fetch service detects one or more new keys, the fetch service may, for each detected new key, send an HTTP POST request to the image repository 110. In some aspects, the HTTP POST may include the captured product image and the metadata (e.g., image and label metadata) associated with the captured product image. In some aspects, the fetch service may create an HTTP payload with the captured product image as the file and the metadata as the POST request fields. In some aspects, the fetch service may perform the POST request. In some aspects, the image repository 110 may store the captured product image in a file system of the image repository 110 and may store the metadata (e.g., in sqlite). In some aspects, the image repository 110 may return a success code. In some aspects, upon receipt of the success code, the fetch service may delete the key that has been stored in the image repository 110 from the database 112.

In some aspects, the server computer system 102 may convey and the inspection station 104 that captured the captured product image may receive some or all of the metadata (e.g., image and/or label metadata) associated with the captured product image. For example, in some aspects, for each of the one or more objects detected in the captured product image by the ML model 108, the server computer system 102 may convey the identification of the class of the detected object, the identification of the region of the detected object in the captured product image, and/or the determined probability that the captured product image includes the object of the class in the region of the captured product image. In some aspects, to convey the label metadata, the server computer system 102 may create and convey an enhanced product image by adding the identification of the class of the detected object and the identification of the region of the detected object in the captured product image for each of the detected one or more objects to the conveyed captured product image. However, this is not required, and, in some alternative aspects, the server computer system 102 may just convey to the inspection station 104 metadata associated with the captured product image (and not the captured product image itself).

In some aspects, as shown in FIGS. 8C and 8D, the inspection station 104 that captured the captured product image may be configured to cause a display 210 of the inspection station 104 to display an enhanced product image that includes the conveyed captured product image to which the identification of the class of the detected object and the identification of the region of the detected object in the captured product image for each of the one or more detected objects have been added. In some aspects, the inspection station 104 may receive the enhanced product image. However, this is not required, and, in some alternative aspects, the inspection station 104 may create the enhanced product image by adding the identification of the class of the detected object and the identification of the region of the detected object in the captured product image for each of the one or more detected objects to the conveyed captured product image.

Figure 5:
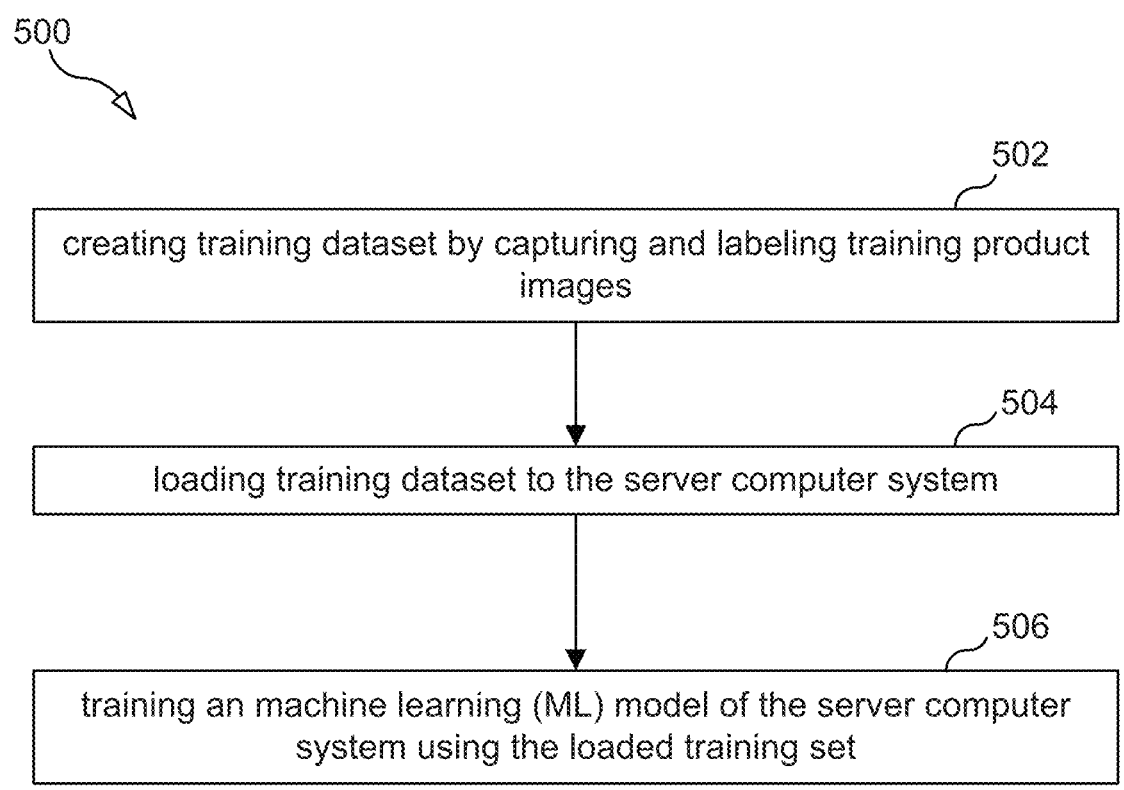
FIG. 5 is a flowchart illustrating a training process according to some aspects.

FIG. 5 illustrates a training process 500 according to some aspects. In some aspects, one or more steps of the process 500 may be performed by the inspection system 100. In some aspects, the training process 500 may train the ML model 108 to detect objects in images of a product 214 including one or more product features to be inspected during assembly of the product 214. In some aspects, the training process 500 may train the ML model 108 to detect objects of a set of classes corresponding to the one or more product features. In some aspects, for each of the one or more product features, the set of classes may include an acceptable product feature class and an unacceptable product feature class.

In some aspects, the training process 500 may include a step 502 of creating a training dataset. In some aspects, the training dataset may include training product images and, for each training product image of the training product images, an identification of a class of an object in the training product image and an identification of a region of the object in the training product image. In some aspects, the class of the object may be either an acceptable product feature class or an unacceptable product feature class. In some aspects, the training dataset may include, for each class of the set of classes, a sufficient number of training product images including an object of the class to train the ML model 108 to detect an object of the class in product images. In some aspects, the training dataset may include, for each product feature, a balance between the number of training product images including an object of the acceptable product feature class and the number of training product images including an object of the unacceptable product feature class.

In some aspects, the step 502 may include using a camera 204 of a training station 106 to output a video stream including images of a product 214 in a field of view of the camera 204 of the training station 106 and using a training station computer system 308 of the training station 106 to receive the video stream output by the camera 204 of the training station 106. In some aspects, a stand 206 of the training station 106 may be configured to position the camera 204, and the training product images may include one or more of the images of the product 214 in the field of view of the camera 204 of the training station 106. In some aspects, the step 502 may further include using a robot arm 316 of the training station 106 to position the product 214 in the field of view of the camera 204 of the training station 106.

Figure 6:
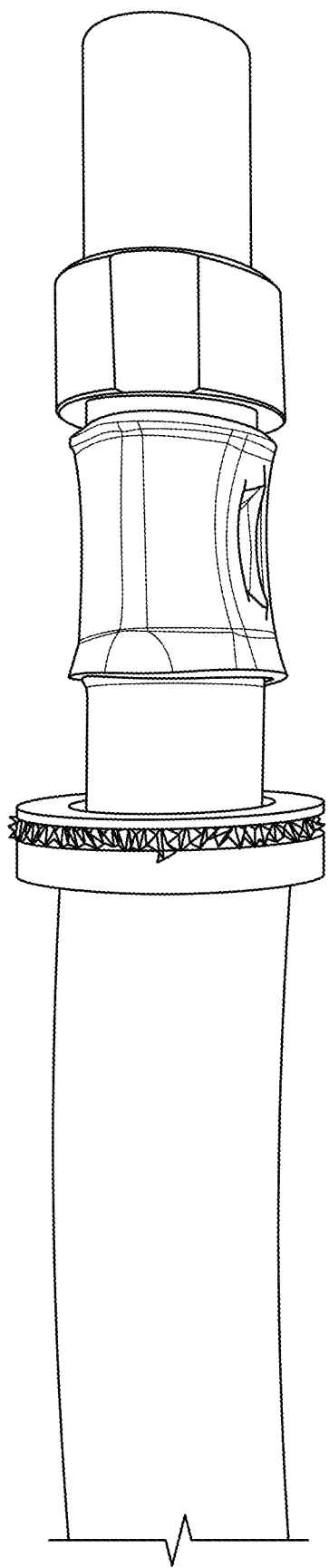
FIG. 6 illustrates a training product image according to some aspects.

In some aspects, the training dataset may include a classes text file that identifies the names of the classes in the set of classes. In some aspects, the classes text file may include, for example and without limitation, a class name for each of the classes shown in FIGS. 4A-4VV. In some aspects, the classes text file may include, for example and without limitation, the classes "Acceptable_Crimp_AMP" and "Unacceptable_Crimp_AMP." In some aspects, a label text file may include the identification of a class of an object in the training product image and an identification of a region of the object in the training product image. For example, a training dataset may include a training product image shown in FIG. 6, which includes an unacceptable crimp, and the label text file for the training product image shown in FIG. 6 may include the text "1 0.628906 0.186343 0.188542 0.254167." In the text, the "1" may be a class ID identifying the Unacceptable_Crimp_AMP, and "0.628906 0.186343 0.188542 0.254167" may be coordinates identifying the rejection of the unacceptable crimp in the training product image shown in FIG. 6.

In some aspects, the training process 500 may include a step 504 of loading the training dataset to the server computer system 102. In some aspects, the training station 106 (e.g., the training station computer system 308 of the training station 106) may load the training dataset to the server computer system 102 (e.g., to a shared drive of the storage medium 111 of the server computer system 102). In some aspects, the training station 106 may use the Server Message Block (SMB) communication protocol to load the training dataset to the server computer system 102.

In some aspects, the training process 500 may include a step 506 of training the ML model using the loaded training dataset. In some aspects, the step 506 may include the server computer system 102 moving the training dataset from the shared drive of the storage medium 111 to a training area (e.g., a training area of the storage medium 111 or of the ML model 108). In some aspects, the step 506 may include the server computer system 102 (e.g., the one or more computers 109 and/or the ML model 108) performing a data preprocessing step to ensure that the training dataset (e.g., the label text files of the training dataset) includes proper class indexes. For example, in some aspects, the data preprocessing step may check that identifications of the classes of the objects in the training product images all fall within a range of possible class identifications.

In some aspects, the step 506 may include the server computer system 102 (e.g., the one or more computers 109 and/or the ML model 108) splitting the training dataset into a training set and a testing set (e.g., 85% and 15%, respectively).

In some aspects, the step 506 may include the server computer system 102 (e.g., the one or more computers 109 and/or the ML model 108) generating an objection detection system (e.g., YOLO version 4 (YOLOV4)) configuration corresponding to the number of classes to be trained. In some aspects, the step 506 may include the server computer system 102 (e.g., the one or more computers 109 and/or the ML model 108) invoking a neural network framework binary (e.g., the precompiled Darknet binary) with the generated objection detection system (e.g., YOLOV4) configuration. In some aspects, the step 506 may include the server computer system 102 (e.g., the one or more computers 109 and/or the ML model 108) training the ML model 108 and dumping the weight files, which may then be used by the server computer system 102. In some aspects (e.g., some Darknet aspects), the server computer system 102 may use a parallel computing platform and application programming interface (e.g., the Compute Unified Device Architecture (CUDA)) to train the ML model 108. In some aspects, the parallel computing platform and application programming interface may allow software of the server computer system 102 to use certain types of graphics processing units for general purpose computing.

Figure 7A:
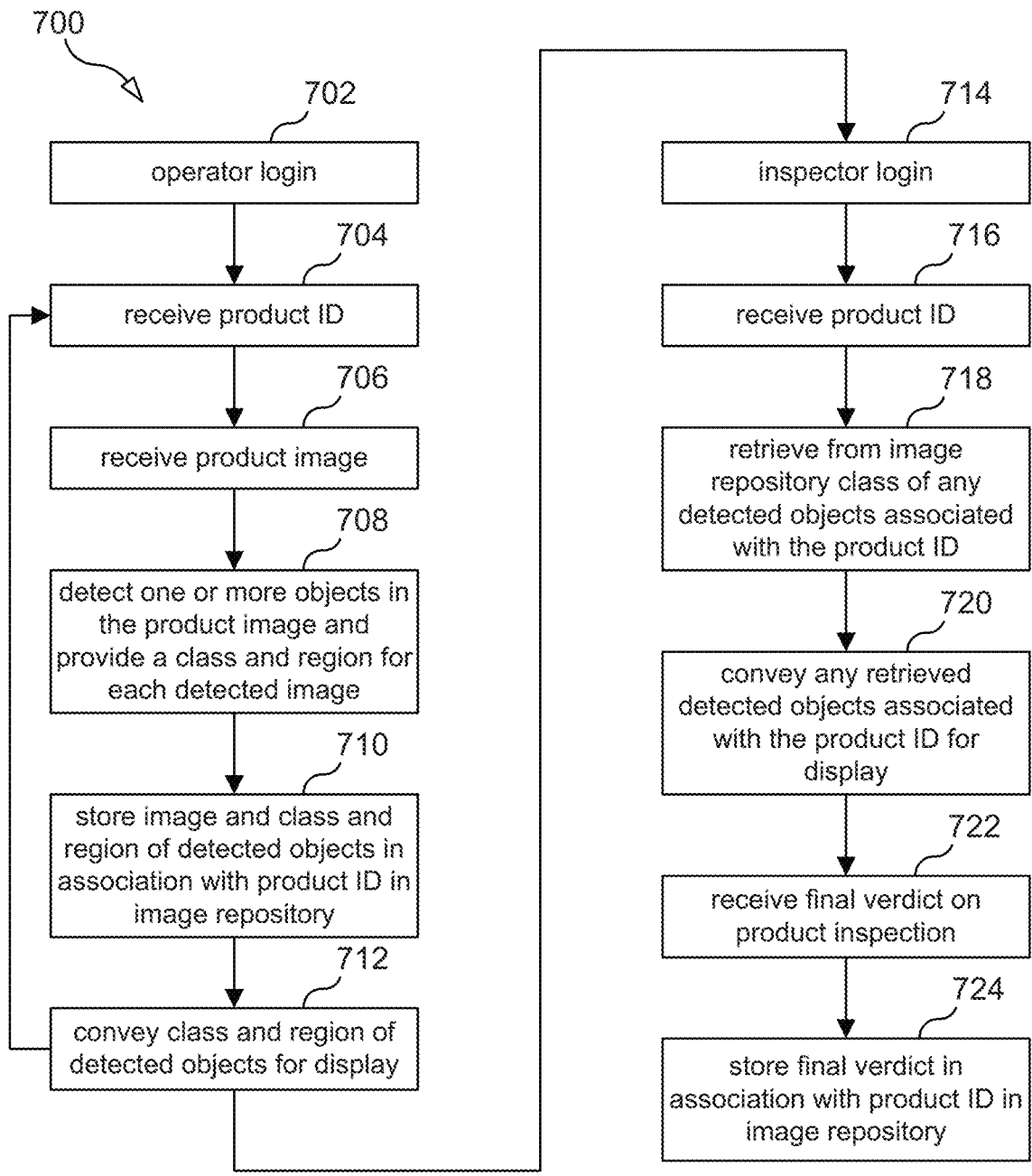
FIGS. 7A-7C are flowcharts illustrating inspection processes according to some aspects.

FIG. 7A illustrates an inspection process 700 according to some aspects. In some aspects, one or more steps of the process 700 may be performed by the inspection system 100. In some aspects, the inspection process 700 may use one or more inspection stations 104 to capture product images of a product 214 including one or more product features to be inspected during assembly of the product 214. In some aspects, the inspection process 700 may use a trained ML model 108 to detect objects of a set of classes corresponding to the one or more product features. In some aspects, for each of the one or more product features, the set of classes may include an acceptable product feature class and an unacceptable product feature class.

Figure 8A:
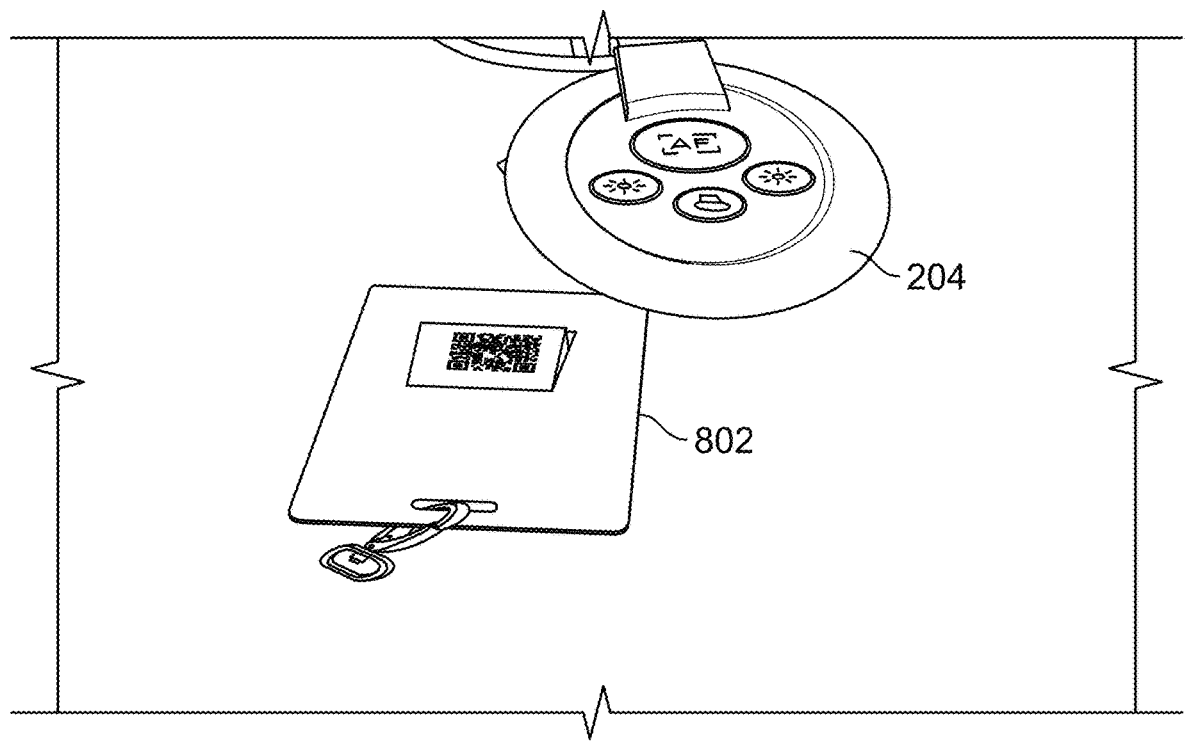
FIG. 8A illustrates entry of a station identification (ID) according to some aspects.

In some aspects, the process 700 may include an operator login step 702 in which an operator of an inspection station 104 logs in. In some aspects, the operator login step 702 may include the inspection station 104 (e.g., the inspection station computer system 208 of the inspection station 104) receiving a station identification (ID) that identifies the inspection station 104. FIG. 8A illustrates an example of entry of the station ID according to some aspects. In some aspects, the operator may place the station ID 802 (e.g., in the form of a matrix barcode such as, for example, a QR code) in the field of view of the camera 204 of the inspection station 104, and the station ID may be captured by the camera 204 and received by the inspection station computer system 208. In some aspects, the operator login step 702 may include the inspection station 104 receiving an operator ID that identifies the operator.

Figure 8B:
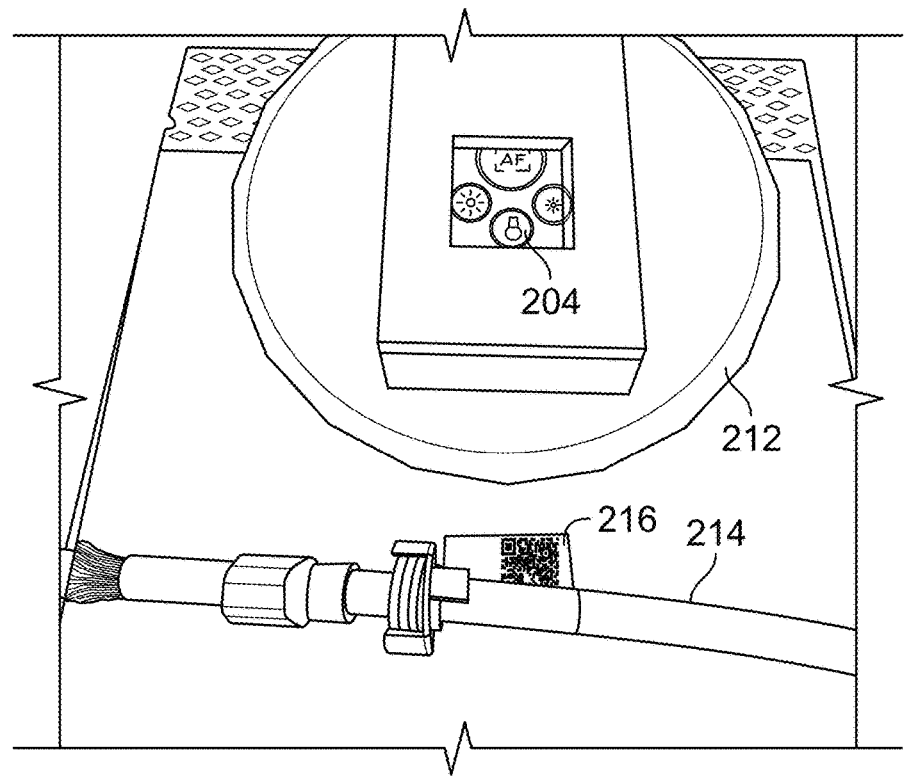
FIG. 8B illustrates entry of a product ID according to some aspects.

In some aspects, the process 700 may include a step 704 in which the inspection station 104 (e.g., the inspection station computer system 208 of the inspection station 104) receives a product ID that identifies the product 214. FIG. 8B illustrates an example of entry of the product ID according to some aspects. In some aspects, the operator may place the product ID 216 (e.g., in the form of a matrix barcode such as, for example, a QR code), which may be attached to the product 214, in the field of view of the camera 204 of the inspection station 104, and the product ID may be captured by the camera 204 and received by the inspection station computer system 208.

In some aspects, the process 700 may include a step 706 in which the inspection station 104 (e.g., the inspection station computer system 208 of the inspection station 104) receives a product image of the product 214, which may include one or more product features to be inspected. In some aspects, as shown in FIGS. 8C and 8D, the camera 204 of the inspection station 104 may capture the product image. In some aspects, the step 706 may include using the camera 204 to output a video stream including captured product images of a product 214 in a field of view of the camera 204. As shown in FIGS. 8C and 8D, a stand 206 of the inspection station 104 may be configured to position the camera 204. In some aspects, the step 706 may include using the inspection station computer system 208 of the inspection station 104 to receive the video stream.

In some aspects, the step 706 may include the inspection station 104 (e.g., the inspection station computer system 208 of the inspection station 104) conveying a captured product image of the captured product images. In some aspects, the step 706 may include the server computer system 102 receiving the conveyed captured product image. In some aspects, in step 706, the inspection station 104 may also convey image metadata associated with the captured product image, and the server computer system 102 may receive the image metadata. In some aspects, the image metadata associated with the captured product image may include the inspection station ID received in step 702, the product ID received in step 704, an image ID of the captured product image, and/or a timestamp for the captured product image.

In some aspects, the process 700 may include a step 708 in which the ML model 108 of the server computer system 102 detects one or more objects in the captured product image and provides, for each of the detected one or more objects, an identification of a class of the detected object and an identification of a region of the detected object in the captured product image.

In some aspects, the process 700 may include a step 710 in which the server computer system 102 stores the captured product image in the image repository 110. In some aspects, in step 710, the server computer system 102 may store the captured product image in the image repository 110 with metadata associated with the captured product image. In some aspects, the metadata associated with the captured product image may include the image metadata and label metadata. In some aspects, the label metadata may include, for each of the one or more objects detected in the captured product image by the ML model 108, the identification of the class of the detected object, the identification of the region of the detected object in the captured product image, and/or the determined probability that the captured product image includes the object of the class in the region of the captured product image.

In some aspects, the process 700 may include a step 712 in which the server computer system 102 conveys and the inspection station 104 that captured the captured product image receives some or all of the metadata (e.g., image and/or label metadata) associated with the captured product image. For example, in some aspects, for each of the one or more objects detected in the captured product image by the ML model 108, the server computer system 102 may convey the identification of the class of the detected object, the identification of the region of the detected object in the captured product image, and/or the determined probability that the captured product image includes the object of the class in the region of the captured product image.

In some aspects, as shown in FIGS. 8C and 8D, the step 712 may include the inspection station 104 that captured the captured product image causing a display 210 of the inspection station 104 to display an enhanced product image that includes the conveyed captured product image to which the identification of the class of the detected object and the identification of the region of the detected object in the captured product image for each of the one or more detected objects have been added. In some aspects, the inspection station 104 may receive the enhanced product image, which may have been created by the server computer system 102. However, this is not required, and, in some alternative aspects, the inspection station 104 may create the enhanced product image by adding the identification of the class of the detected object and the identification of the region of the detected object in the captured product image for each of the one or more detected objects to the conveyed captured product image.

In the example shown in FIG. 8C, the ML model 108 detected an object of the acceptable KSTL distance sleeve orientation class, and the display 210 is displaying an enhanced product image that includes the conveyed captured product image to which the identification of the acceptable KSTL distance sleeve orientation class of the detected object and the identification of the region of the detected object in the captured product image have been added. In the example shown in FIG. 8D, the ML model 108 detected an object of the unacceptable KSTL distance sleeve orientation class, and the display 210 is displaying an enhanced product image that includes the conveyed captured product image to which the identification of the unacceptable KSTL distance sleeve orientation class of the detected object and the identification of the region of the detected object in the captured product image have been added.

In some aspects, steps 704-712 of the process 700 may be repeated at one or more additional stages of assembly of the product 214 and/or for one or more different products 214.

In some aspects, the process 700 may include a step 714 in which an inspector logs in (e.g., at an inspection station 104). In some aspects, an inspector may be an operator with qualifications and/or permission to give a final verdict on approval or disapproval of a product 214. In some aspects, the inspector login step 714 may include the inspection station 104 (e.g., the inspection station computer system 208 of the inspection station 104) receiving an inspector ID that identifies the operator.

In some aspects, the process 700 may include a step 716 in which the inspection station 104 (e.g., the inspection station computer system 208 of the inspection station 104) receives a product ID that identifies the product 214. FIG. 8B illustrates an example of entry of the product ID according to some aspects. In some aspects, the inspector may place the product ID 216 (e.g., in the form of a matrix barcode such as, for example, a QR code), which may be attached to the product 214, in the field of view of the camera 204 of the inspection station 104, and the product ID may be captured by the camera 204 and received by the inspection station computer system 208.

In some aspects, the process 700 may include steps 718 and 720 in which identifications of the classes of any detected objects associated with the product ID received in step 716 are retrieved from the image repository 110 and received by the inspection station 104 for display. In some aspects, the step 718 may include the inspection station 104 (e.g., the inspection station computer system 208 of the inspection station 104) conveying and the server computer system 102 receiving the product ID received in step 716. In some aspects, the step 718 may include the server computer system 102 retrieving identifications of the classes of any detected objects associated with the product ID from the image repository 110, and the step 720 may include the server computer system 102 conveying the identifications of the classes to the inspection station 104 for display on the display 210.

In some alternative aspects, in steps 718 and 720, after receiving the product ID, the server computer system 102 may transform the product ID into a URL that can be understood by the image repository 110. In some aspects, the server computer system 102 may convey and the inspection station 104 (e.g., the inspection station computer system 208 of the inspection station 104) may receive the URL. In some aspects, the inspection station 104 (e.g., the inspection station computer system 208 of the inspection station 104) may open the URL (e.g., in a new browser tab), which may result in the display 210 displaying a list of identifications of the classes of any objects detected in any captured product images associated with the product ID received in step 716. FIG. 8E illustrates an example of a displayed list of identifications of the classes of objects detected in captured product images associated with the product ID WO5555.

In some aspects, in steps 718 and 720, in addition to (or as an alternative to) retrieving and displaying identifications of the classes of any detected objects associated with the product ID received in step 716, the inspection station 104 may receive and display a determination by the inspection system 100 (e.g., the server computer system 102 of the inspection system 100) that the product 214 is acceptable or unacceptable. In some aspects, the inspection system 100 may determine that the product 214 is unacceptable if, for any of the product features of the product 214, the class of the detected object is the unacceptable product feature class for the product feature. In some aspects, the inspection system 100 may determine that the product 214 is acceptable if, for each of the product features of the product 214, the class of the detected object is the acceptable product feature class for the product feature.

In some aspects, the process 700 may include a step 722 in which the inspection system 100 receives a final verdict (e.g., approve or disapprove) on the inspection of the product 214. In some aspects, the inspector may input the final verdict using the inspection station 104, the inspection station 104 (e.g., the inspection station computer system 208 of the inspection station 104) may receive the final verdict and convey the final verdict, and the server computer system 102 may receive the conveyed final verdict. In some aspects, the product ID of the product 214 (e.g., recited in step 716) may be conveyed with the final verdict.

In some aspects, the process 700 may include a step 724 of storing the final verdict in association with the product ID in the image repository 110.

Figure 7B:
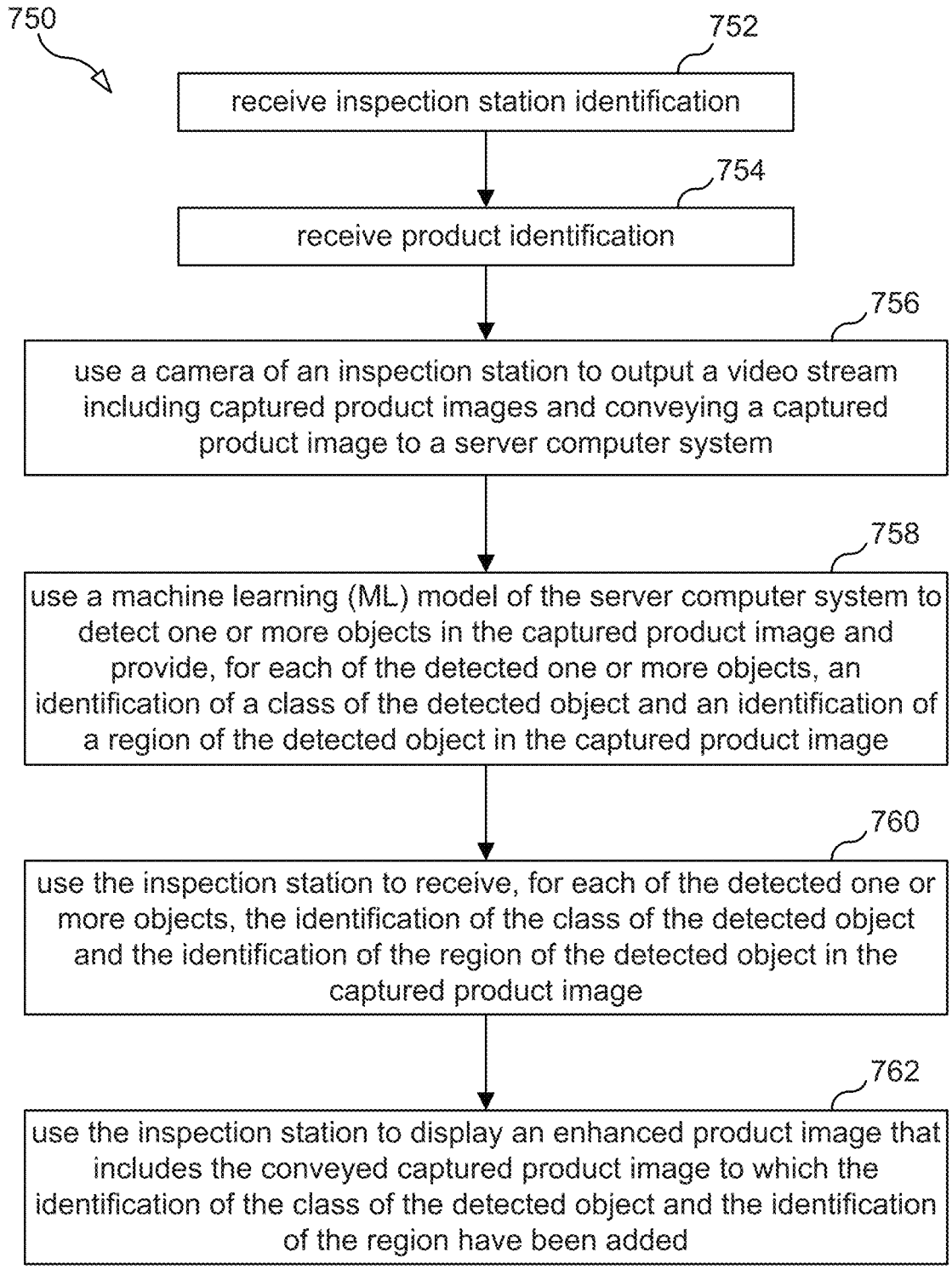

FIG. 7B illustrates an inspection process 750 according to some aspects. In some aspects, one or more steps of the process 750 may be performed by the inspection system 100. In some aspects, the inspection process 750 may inspect a product 214, and the product 214 may include one or more product features (e.g., one or more product features to be inspected). In some aspects, the product 214 may be a wire harness, and the one or more product features may be wire harness features.

In some aspects, the process 750 may include a step 752 in which the inspection station 104 (e.g., the inspection station computer system 208 of the inspection station 104) receives a station identification (ID) that identifies the inspection station 104. FIG. 8A illustrates an example of entry of the station ID according to some aspects. In some aspects, an operator may place the station ID 802 (e.g., in the form of a matrix barcode such as, for example, a QR code) in the field of view of the camera 204 of the inspection station 104, and the station ID may be captured by the camera 204 and received by the inspection station computer system 208.

In some aspects, the process 750 may include a step 754 in which the inspection station 104 (e.g., the inspection station computer system 208 of the inspection station 104) receives a product ID that identifies the product 214. FIG. 8B illustrates an example of entry of the product ID according to some aspects. In some aspects, the operator may place the product ID 216 (e.g., in the form of a matrix barcode such as, for example, a QR code), which may be attached to the product 214, in the field of view of the camera 204 of the inspection station 104, and the product ID may be captured by the camera 204 and received by the inspection station computer system 208.

In some aspects, the process 750 may include a step 756 of using the camera 204 of the inspection station 104 to output a video stream including captured product images of a product 214 in a field of view of the camera 204. In some aspects, the camera 204 of the inspection station 104 may have a resolution of at least 13MP. In some aspects, the video output by the camera 204 of the inspection station 104 may have at least a 4K resolution.

In some aspects, the step 756 may include using an inspection station computer system 208 of the inspection station 104 to receive the video stream. In some aspects, the step 756 may include using the inspection station computer system 208 to convey a captured product image of the captured product images. In some aspects, the step 756 may include using a server computer system 102 to receive the conveyed captured product image.

In some aspects, the step 756 may further include using a light 212 of the inspection station 104 to illuminate the product 214 in the field of view of the camera 204, and the stand 206 of the inspection station 104 may position the light 212. In some aspects, the light 212 of the inspection station 104 may be a light emitting diode (LED) ring light.

In some aspects, the process 750 may include a step 758 of using a machine learning (ML) model 108 of the server computer system 102 to detect one or more objects in the captured product image and provide, for each of the detected one or more objects, an identification of a class of the detected object and an identification of a region of the detected object in the captured product image. In some aspects, the class of the detected object may be either an acceptable product feature class or an unacceptable product feature class.

In some aspects, using the ML model of the server computer system to detect the one or more objects in the captured product image in step 758 may include: for each class of a set of classes, using the ML model of the server computer system to determine a probability that the captured product image includes an object of the class in a region of the captured product image; and for each determined probability that exceeds a probability threshold, determining that the region of the captured product image includes the object of the class. In some aspects, the product 214 may be a wire harness, and the set of classes may include two or more of the following classes: an acceptable endcap placement class, an unacceptable endcap placement class, an acceptable tie wrap class, an unacceptable tie wrap class, an acceptable sleeve placement class, an unacceptable sleeve placement class, an acceptable crimp class, an unacceptable crimp class, an acceptable jacket placement class, an unacceptable jacket placement class, an acceptable placed lugs class, an unacceptable placed lugs class, an acceptable heated heat shrink class, an unacceptable heated heat shrink class, an acceptable weld class, an unacceptable weld class, an acceptable shield braid class, and an unacceptable shield braid class. In some aspects, the set of classes may include two or more of the classes shown in FIGS. 4A-4VV.

In some aspects, the process 750 may include a step 760 of using the inspection station computer system 104 to receive, for each of the detected one or more objects, the identification of the class of the detected object and the identification of the region of the detected object in the captured product image.

In some aspects, the process 750 may include a step 762 of using the inspection station computer system to cause a display 210 of the inspection station 104 to display an enhanced product image that includes the conveyed captured product image to which the identification of the class of the detected object and the identification of the region of the detected object in the captured product image for each of the detected one or more objects have been added.

In some aspects, the process 750 may further include using the server computer system 102 to create the enhanced product image by adding the identification of the class of the detected object and the identification of the region of the detected object in the captured product image for each of the detected one or more objects to the conveyed captured product image, and the step 760 may include receiving the enhanced product image. In some alternative aspects, the step 762 may include using the inspection station computer system 104 to create the enhanced product image by adding the identification of the class of the detected object and the identification of the region of the detected object in the captured product image for each of the detected one or more objects to the conveyed captured product image.

In some aspects, the process 750 may further include using an image repository 110 to store the conveyed captured product image and, for each of the detected one or more objects, the identification of the class of the detected object and the identification of the region of the detected object in the captured product image.

Figure 7C:
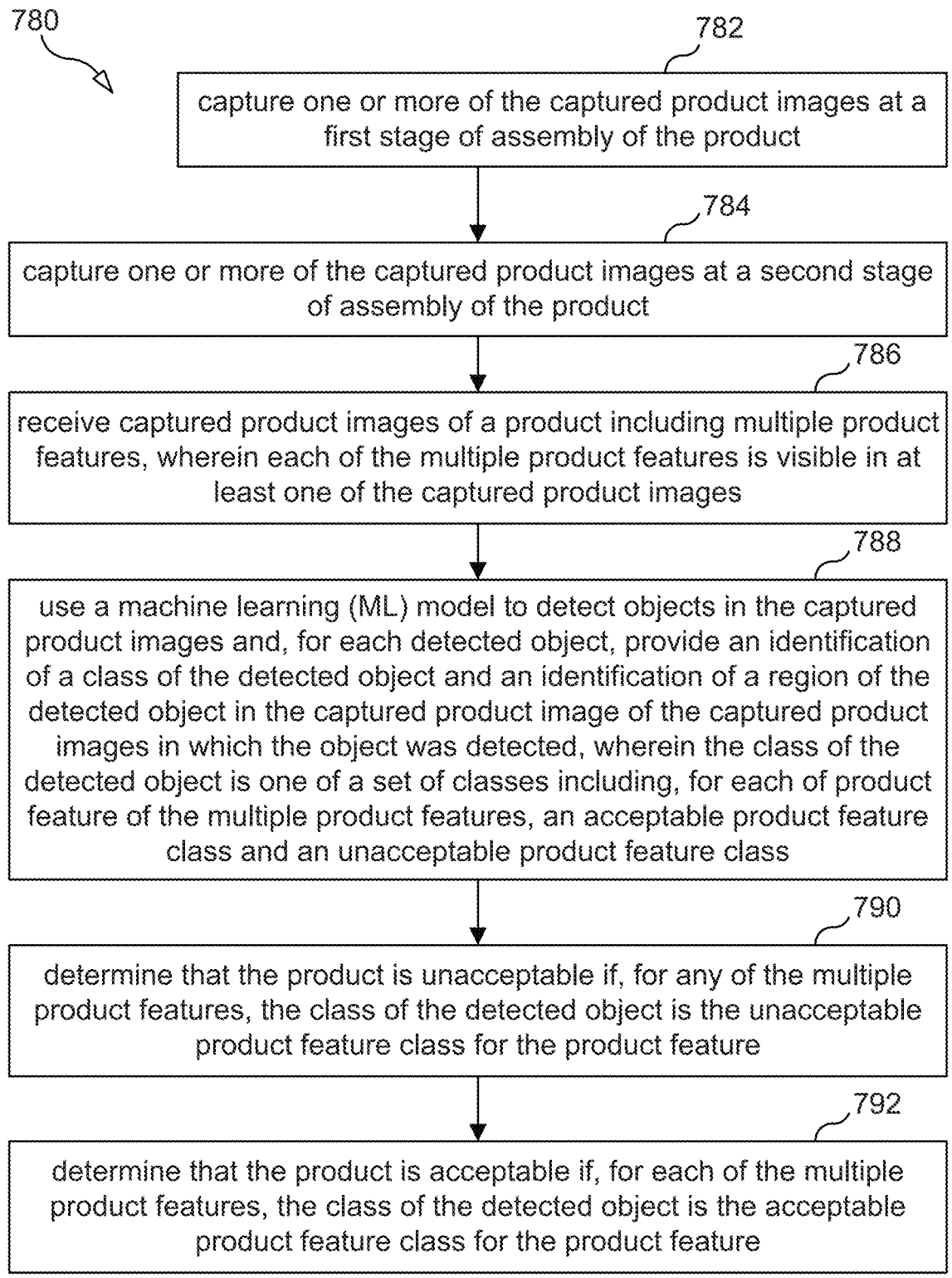

FIG. 7C illustrates an inspection process 780 according to some aspects. In some aspects, one or more steps of the process 780 may be performed by the inspection system 100. In some aspects, the inspection process 780 may inspect a product 214, and the product 214 may include multiple product features (e.g., multiple product features to be inspected). In some aspects, the product 214 may be a wire harness, and the one or more product features may be wire harness features.

In some aspects, the process 780 may include a step 782 of capturing one or more product images at a first stage of assembly of the product 214. In some aspects, the process 780 may include a step 784 of capturing one or more product images at a second stage of assembly of the product, and the second stage may be different than the first stage. In some aspects, the process 780 may include capturing one or more product images at one or more additional stages of assembly of the product 214. At each of the stages of assembly of the product 214, the product images may be captured using an inspection station 104 (e.g., using a camera 204 and an inspection station computer system 208 of an inspection station 104). In some aspects, the same inspection station 104 may be used to capture product images at two or more or all of the stages of assembly of the product 214 (e.g., inspection station 104a may capture products images at the first and second stages of assembly). In some alternative aspects, two or more different inspection stations 104 may be used to capture product images at stages of assembly of the product 214 (e.g., inspection station 104*a* may capture one or more product images at the first stages of assembly, and inspection station 104*b* may capture one or more product images at the second stages of assembly).

Figure 9B:
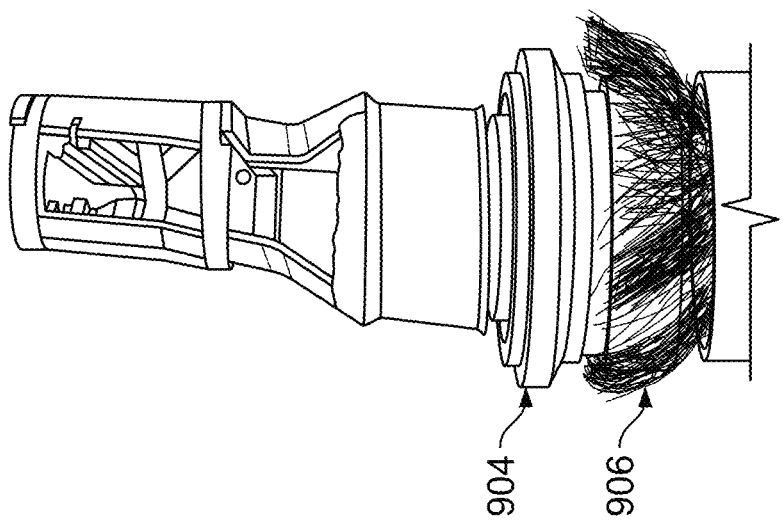
FIGS. 9A-9E illustrate inspection points during assembly of a product according to some aspects.
Figure 9A:
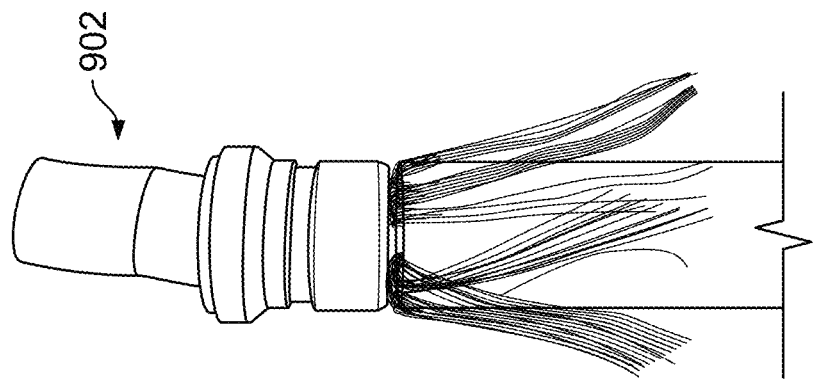
Figure 9D:
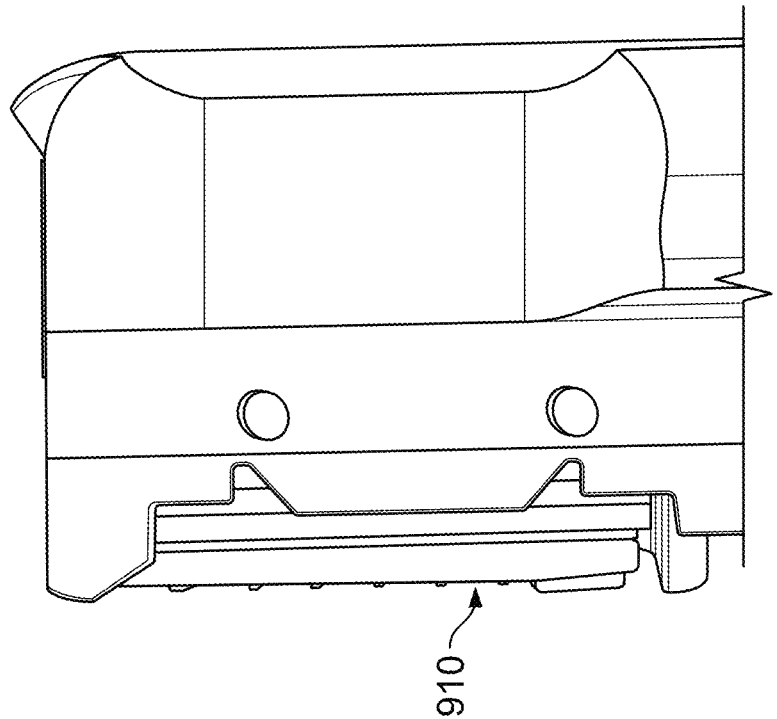
Figure 9C:
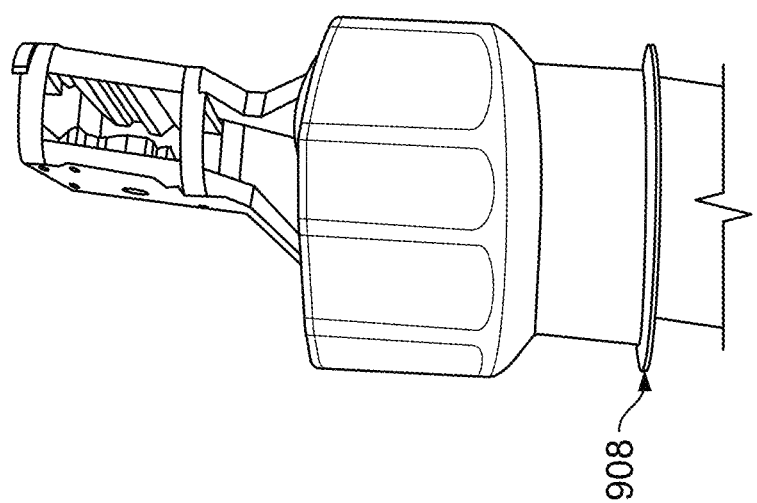
Figure 9E:
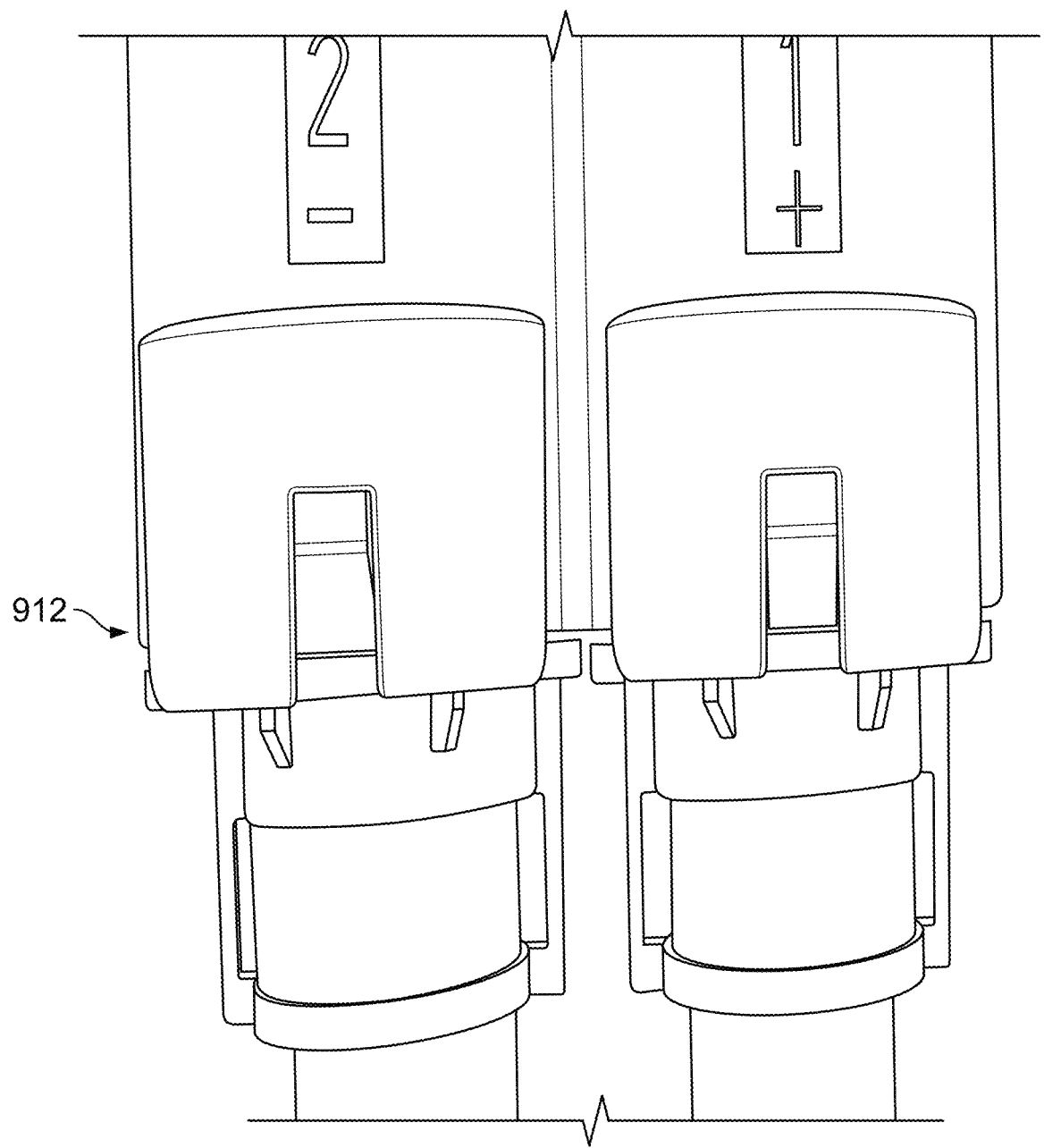

In an example in which the product 214 includes a Coastal connector, as shown in FIGS. 9A-9E, the product 214 may include the following product features for inspection: (i) distance sleeve orientation 902, (ii) terminal crimp quality 904, (iii) shield braid condition 906, (iv) aluminum sleeve placement 908, (v) connector locks 910, and (vi) end cap lock position 912. In some aspects, the distance sleeve orientation 902 may be inspected at a first stage of assembly, as shown in FIG. 9A. In some aspects, the terminal crimp quality 904 and the shield braid condition 906 may be inspected at a second stage of assembly, as shown in FIG. 9B. In some aspects, the aluminum sleeve placement 908 may be inspected at a third stage of assembly, as shown in FIG. 9C. In some aspects, the connector locks 910 and end cap lock position 912 may be inspected at fourth and fifth stages of assembly, as shown in FIGS. 9D and 9E, respectively.

Figure 10B:
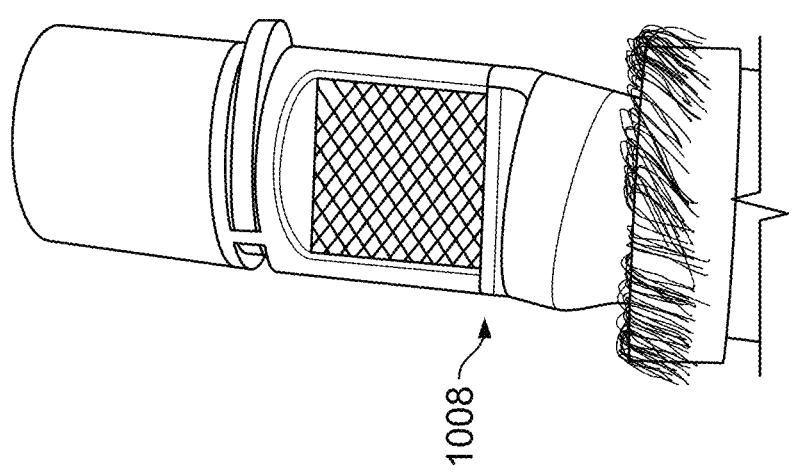
FIGS. 10A-10D illustrate inspection points during assembly of a product according to some aspects.
Figure 10A:
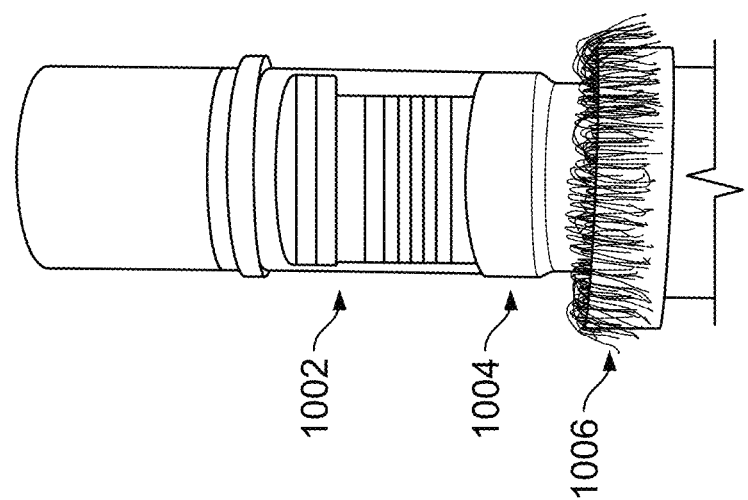
Figure 10D:
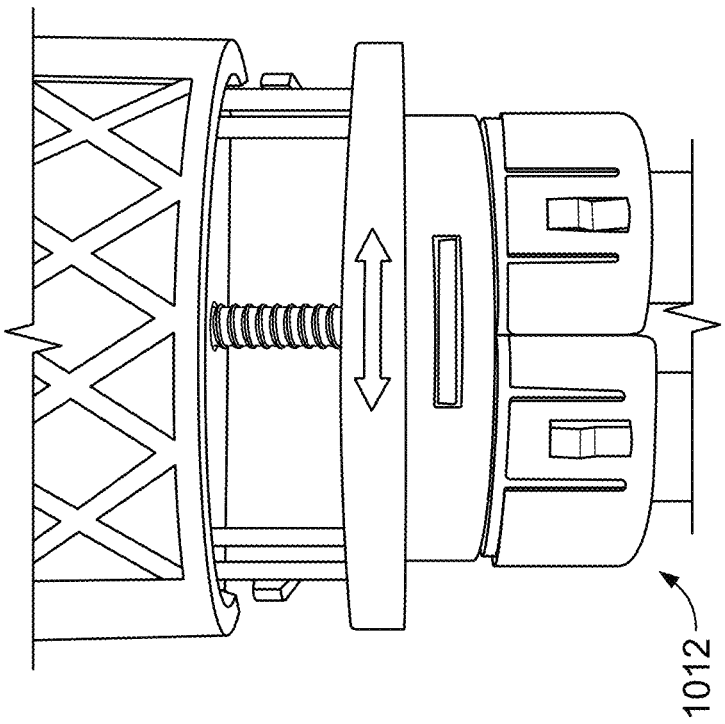
Figure 10C:
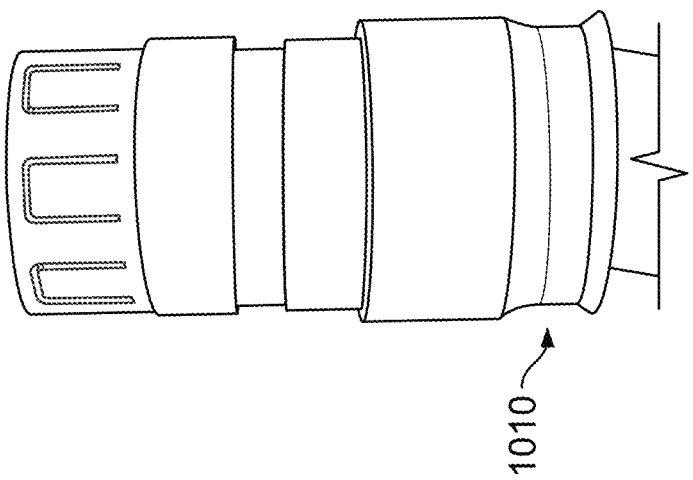

In an example in which the product 214 includes a Rosenberger connector, as shown in FIGS. 10A-10E, the product 214 may include the following product features for inspection: (i) weld quality 1002, (ii) shield braid and connector connection 1004, (iii) cleaning of shield braid 1006, (iv) weld placement 1008, (v) crimp quality 1010, and (vi) end cap lock position 1012. In some aspects, the weld quality 1002, shield braid and connector connection 1004, and cleaning of shield braid 1006 may be inspected at a first stage of assembly, as shown in FIG. 10A. In some aspects, the weld placement 1008 may be inspected at a second stage of assembly, as shown in FIG. 10B. In some aspects, the crimp quality 1010 may be inspected at a third stage of assembly, as shown in FIG. 10C. In some aspects, the end cap lock position 1012 may be inspected at a fourth stage of assembly, as shown in FIG. 10D.

Figure 11B:
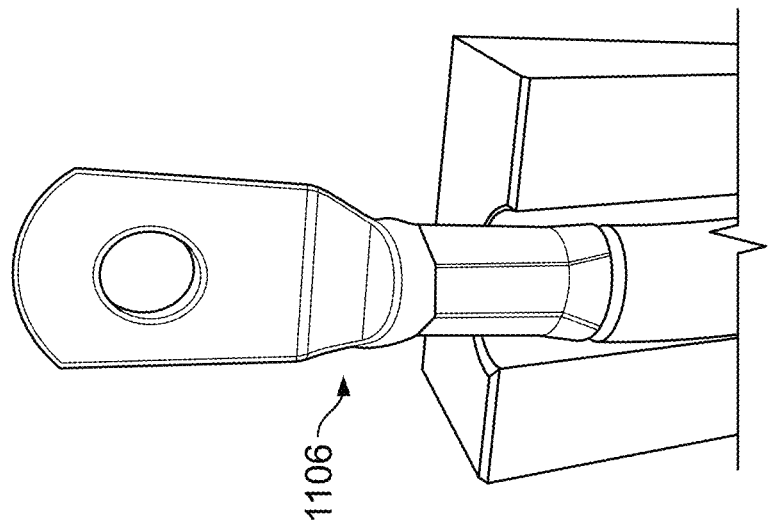
FIGS. 11A, 11B, and 11D illustrate inspection points during assembly of a product according to some aspects.
Figure 11A:
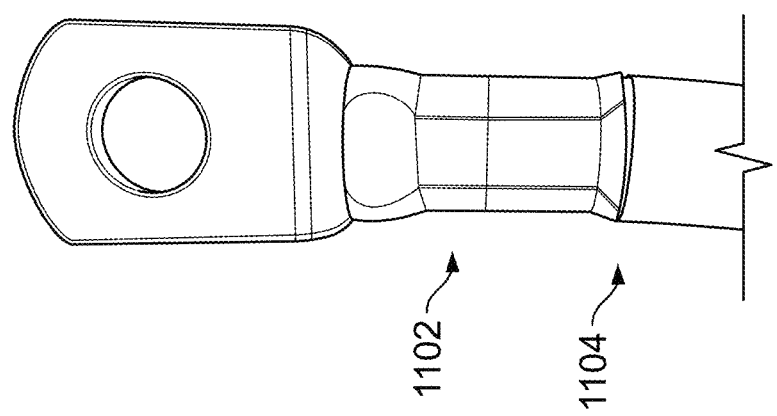
Figure 11D:
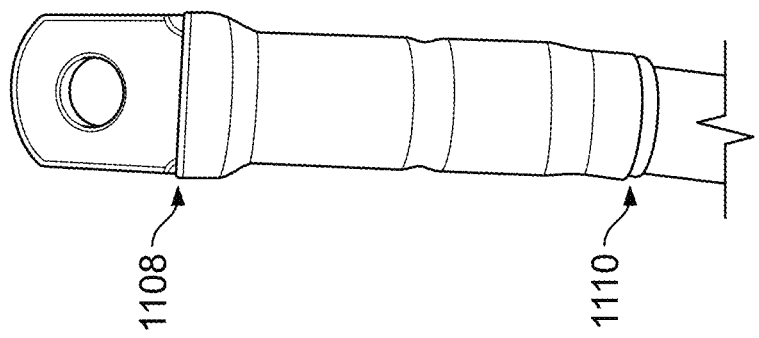
Figure 11C:
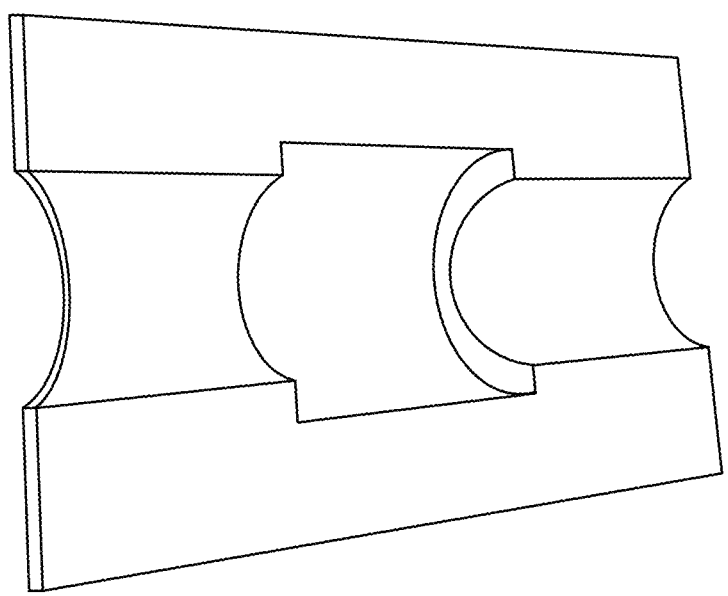
FIG. 11C illustrates a fixture according to some aspects.

In an example in which the product 214 includes a lug connector, as shown in FIGS. 11A, 11B, and 11D, the product 214 may include the following product features for inspection: (i) lugs crimp quality 1102, (ii) lugs placement with jacket 1104, (iii) conductor placement in lugs 1106, (iv) heat shrink placement 1108, and (v) heat shrink melting condition 1110. In some aspects, the lugs crimp quality 1102 and lugs placement with jacket 1104 may be inspected at a first stage of assembly, as shown in FIG. 11A. In some aspects, the conductor placement in lugs 1106 may be inspected at the first stage of assembly with the conductor 214 in a fixture, as shown in FIG. 11B. FIG. 11C illustrates an example of a fixture. However, the use of fixtures is not required, and, in some alternative aspects, fixtures may not be used. In some aspects, the heat shrink placement 1108 and heat shrink melting condition 1110 may be inspected in a second stage of assembly, as shown in FIG. 11D.

Figure 12:
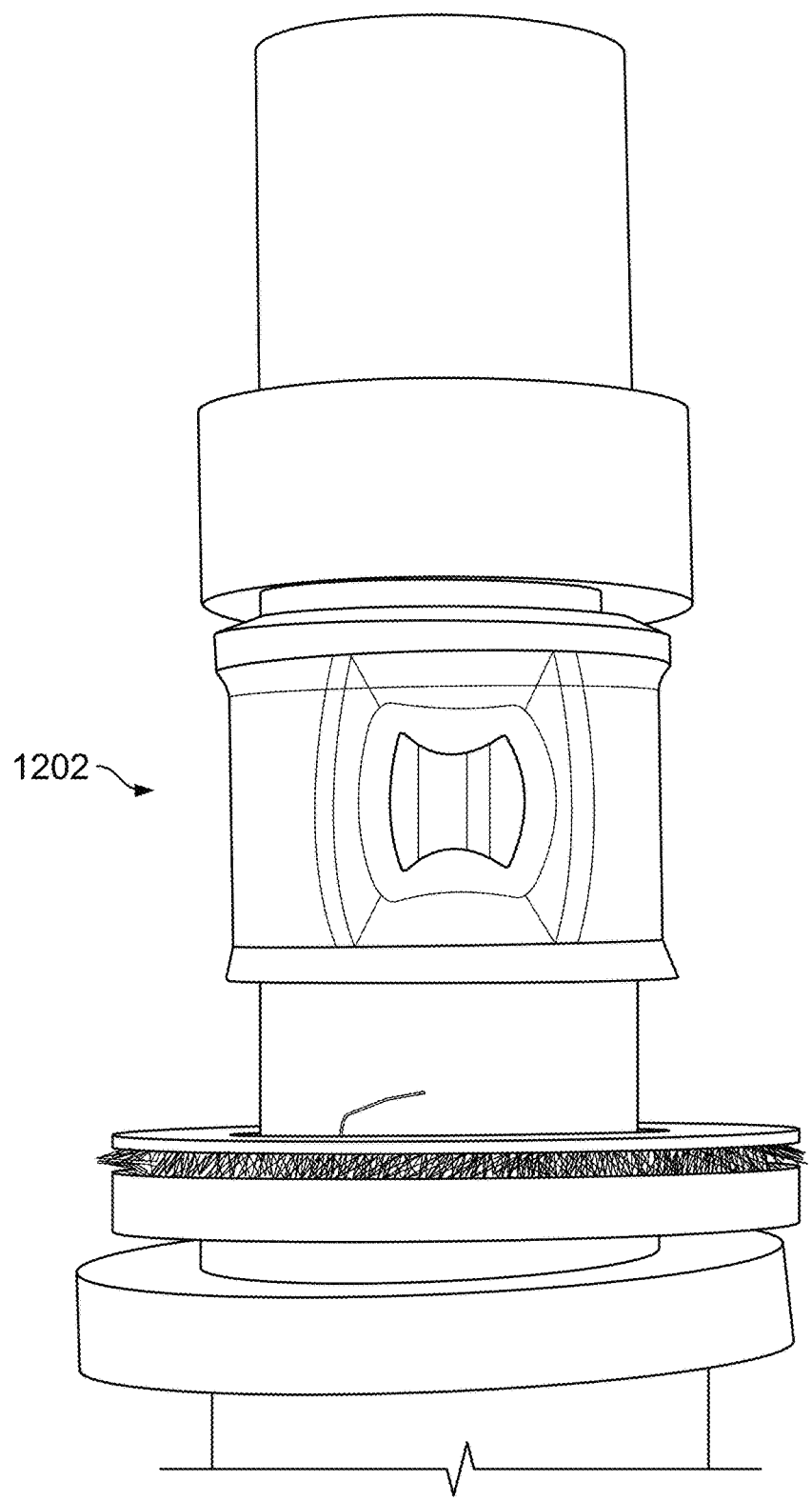
FIG. 12 illustrates an inspection point during assembly of a product according to some aspects.

In an example in which the product 214 includes an Amphenol connector, as shown in FIG. 12, the product 214 may include the product feature of crimp quality 1202 for inspection. In an example in which the product 214 includes a Coastal connector, a Rosenberger connector, a lug connector, and an Amphenol connector, the product 214 may be inspected at the stages of assembly shown in FIGS. 9A-11B, 11D, and 12.

In some aspects, the process 780 may include a step 786 of receiving captured product images of a product 214 including multiple product features, and each of the multiple product features may be visible in at least one of the captured product images.

In some aspects, the process 780 may include a step 788 of using the ML model 108 to detect objects in the captured product images and, for each detected object, provide an identification of a class of the detected object and an identification of a region of the detected object in the captured product image of the captured product images in which the object was detected. In some aspects, the class of the detected object may be one of a set of classes including, for each of product feature of the multiple product features, an acceptable product feature class and an unacceptable product feature class. For example, if the product 214 includes the product features of lugs crimp quality 1102 and heat shrink placement 1108, the set of classes would include an acceptable lugs crimp quality class, an unacceptable lugs crimp quality class, an acceptable heat shrink placement class, and an unacceptable heat shrink placement class. In some aspects, the inspection system 100 may perform the step 788 on-the-fly (e.g., as the captured product images are received in step 786). However, this is not required, and, in some alternative aspects, the inspection system 100 may perform the step 788 after the captured product images are received in step 786.

In some aspects, using the ML model to detect objects in the captured product images in step 788 may include, for each captured product image of the captured product images: for each class of the set of classes, using the ML model 108 of the server computer system 102 to determine a probability that the captured product image includes an object of the class in a region of the captured product image; and, for each determined probability that exceeds a probability threshold, determining that the region of the captured product image includes the object of the class.

In some aspects, the product 214 may be a wire harness, and the set of classes may include two or more of the following classes: acceptable endcap placement, unacceptable endcap placement, acceptable tie wrap, unacceptable tie wrap, acceptable sleeve placement, unacceptable sleeve placement, acceptable crimp, unacceptable crimp, acceptable jacket placement, unacceptable jacket placement, acceptable placed lugs, unacceptable placed lugs, acceptable heated heat shrink, unacceptable heated heat shrink, acceptable weld, unacceptable weld, acceptable shield braid, and unacceptable shield braid. In some aspects, the set of classes may include two or more of the classes shown in FIGS. 4A-4VV.

In some aspects, the process 780 may include a step 790 of determining that the product 214 is unacceptable if, for any of the multiple product features, the class of the detected object is the unacceptable product feature class for the product feature. In some aspects, the process 780 may include a step 792 of determining that the product 214 is acceptable if, for each of the multiple product features, the class of the detected object is the acceptable product feature class for the product feature.

In some aspects, the process 780 may further include training the ML model 108. In some aspects, training the ML model may include using a training dataset to train the ML model 108, the training dataset may include training product images and, for each training product image of the training product images, an identification of a class of an object in the training product image and an identification of a region of the object in the training product image, and the class of the object may be either an acceptable product feature class or an unacceptable product feature class.

In some aspects, the one or more inspection stations 104 may be used exclusively for inspection of products 214, and the one or training stations 106 may be used exclusively for training. However, this is not required, and, in some alternative aspects, one or more of the inspection stations 104 or training stations 106 may be used interchangeably (e.g., for training at one or more time periods and for inspection at one or more different time periods). In some aspects, one or more captured product images captured during inspection of one or more products 214 may subsequently be used to training or re-training the ML model 108.

Figure 13:
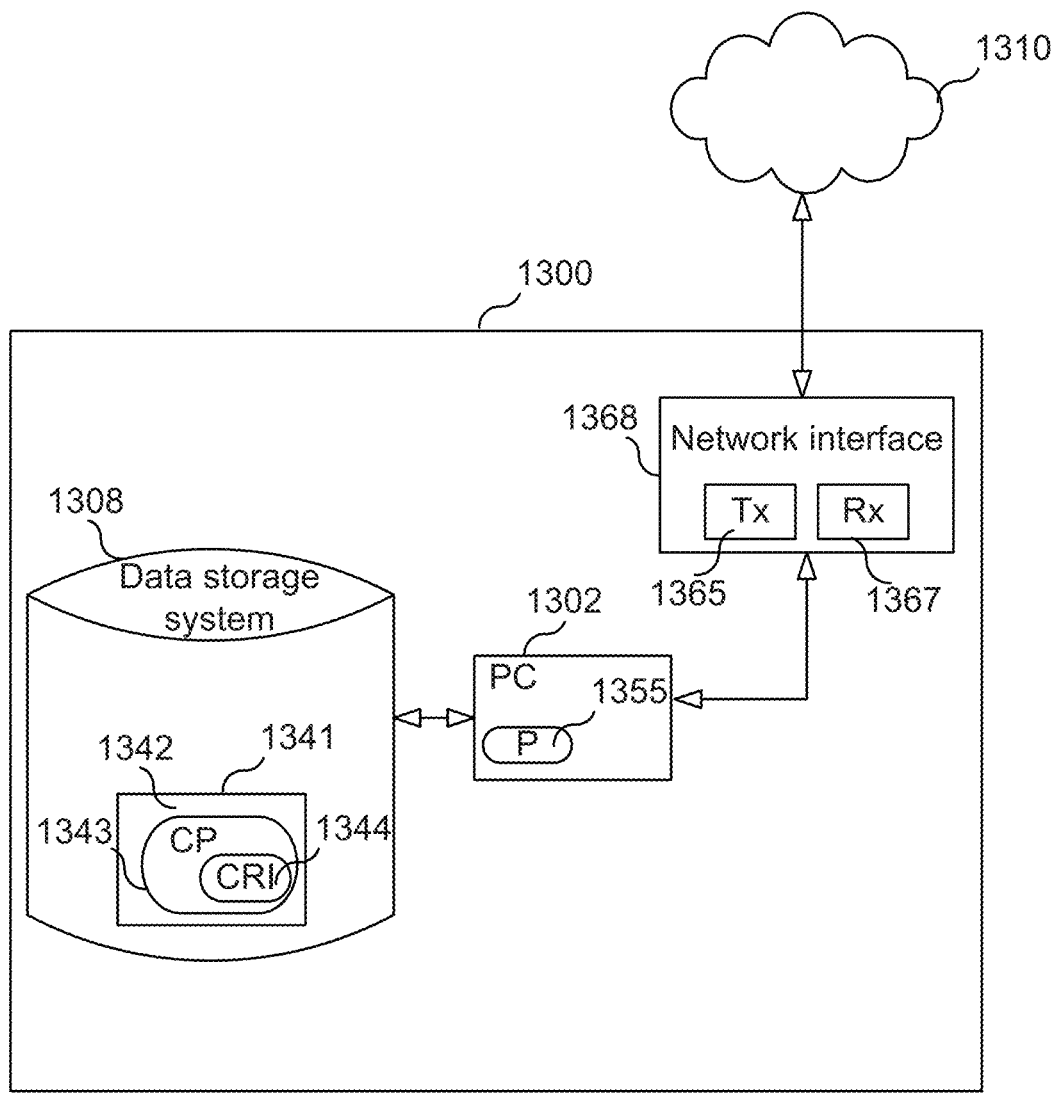
FIG. 13 is a block diagram illustrating an apparatus according to some aspects.

FIG. 13 is a block diagram of an apparatus 1300 (e.g., inspection station computer system 208, training station computer system 308, the server computer system 102, or the one or more computers 109 of the server computer system 102), according to some aspects. As shown in FIG. 13, apparatus 1300 may include: processing circuitry (PC) 1302, which may include one or more processors (P) 1355 (e.g., a general purpose microprocessor and/or one or more other processors, such as an application specific integrated circuit (ASIC), field-programmable gate arrays (FPGAs), and the like), which processors may be co-located in a single housing or in a single data center or may be geographically distributed (i.e., apparatus 1300 may be a distributed computing apparatus); at least one network interface 1368 comprising a transmitter (Tx) 1365 and a receiver (Rx) 1367 for enabling apparatus 1300 to transmit data to and receive data from other nodes connected to a network 1310 (e.g., an Internet Protocol (IP) network) to which network interface 1368 is connected (directly or indirectly) (e.g., network interface 1368 may be wirelessly connected to the network 1310, in which case network interface 1368 is connected to an antenna arrangement); and a storage unit (a.k.a., "data storage system") 1308, which may include one or more non-volatile storage devices and/or one or more volatile storage devices. In some alternative aspects, network interface 1368 may be connected to the network 1310 over a wired connection, for example over an optical fiber or a copper cable. In some aspects where PC 1302 includes a programmable processor, a computer program product (CPP) 1341 may be provided. CPP 1341 includes a computer readable medium (CRM) 1342 storing a computer program (CP) 1343 comprising computer readable instructions (CRI) 1344. CRM 1342 may be a non-transitory computer readable medium, such as, magnetic media (e.g., a hard disk), optical media, memory devices (e.g., random access memory, flash memory), and the like. In some aspects, the CRI 1344 of computer program 1343 is configured such that when executed by PC 1302, the CRI causes apparatus 1300 to perform steps of the methods described herein (e.g., steps described herein with reference to one or more of the flow charts). In some other aspects, an apparatus 1300 may be configured to perform steps of the methods described herein without the need for code. That is, for example, PC 1302 may consist merely of one or more ASICs. Hence, the features of the aspects described herein may be implemented in hardware and/or software.

Figure 14:
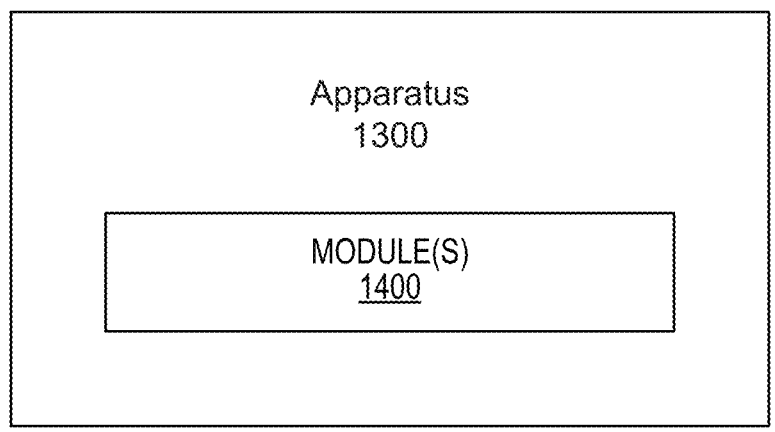
FIG. 14 is a block diagram illustrating an apparatus according to some aspects.

FIG. 14 is a schematic block diagram of the apparatus 1300 according to an aspect. The apparatus 1300 may include one or more modules 1400, each of which is implemented in software. The module(s) 1400 provide the functionality of apparatus 1300 described herein (e.g., steps described herein).

Experimental results of using the inspection system 100 including multiple iterations of the ML model 108 to identify multiple classes of acceptable and unacceptable product features of wire harnesses are shown in the table below.

Relative to iteration 1, improvements were made to the stations to improve the quality of the training product images used for training and testing the ML model 108 for iteration 2 (e.g., augmenting the training product images in the training dataset with copies of training product images that have been modified with increased blur and/or noise). Relative to iteration 2, the training product images had a better balance between classes (e.g., between training product images having objects of acceptable and unacceptable product feature classes), and a robot arm 316 was used to position a product 214 in a field of view of the camera 204. As shown in the table below, by iteration 3, the ML model 108 was detecting and labeling objects of multiple classes with high accuracy. Those skilled in the art would not have expected that an ML model could be used to successfully identify multiple classes of acceptable and unacceptable product features in the inspection of products 214 (e.g., wire harnesses) and certainly not with the high accuracy shown by the experimental results.

| Iteration | Output | Test Cases | Probability Threshold | Accuracy |
|---|---|---|---|---|
| 1 | multi-class, | 13,479 | 0.5 | 0.49 |
|   | multi-label | 13,479 | 0.35 | 0.49 |
| 2 | multi-class, | 6,995 | 0.5 | 0.572 |
|   | multi-label | 6,996 | 0.35 | 0.606 |
| 3 | multi-class, | 992 | 0.5 | 0.76 |
|   | multi-label | 993 | 0.35 | 0.817 |

While various embodiments are described herein, it should be understood that they have been presented by way of example only, and not limitation. Thus, the breadth and scope of this disclosure should not be limited by any of the above-described exemplary embodiments. For example, although aspects of the inspection system 100 were described with the product 214 being a wire harness, this is not required, and, in some alternative aspects, the product 214 may be a different product (e.g., printed circuit boards). Moreover, any combination of the above-described elements in all possible variations thereof is encompassed by the disclosure unless otherwise indicated herein or otherwise clearly contradicted by context.

Additionally, while the processes are described above as a sequence of steps, this was done solely for the sake of description. Accordingly, it is contemplated that some steps may be added, some steps may be omitted, the order of the steps may be re-arranged, and some steps may be performed in parallel.

What is claimed is:

1. A method performed by an inspection system, the method comprising:
    using a camera of an inspection station to output a video stream including captured product images of a product in a field of view of the camera, wherein a stand of the inspection station is configured to position the camera, and the product includes one or more product features;
    using an inspection station computer system of the inspection station to receive the video stream;
    using the inspection station computer system to convey a captured product image of the captured product images;
    using a server computer system to receive the conveyed captured product image;
    using a machine learning (ML) model of the server computer system to detect one or more objects in the captured product image and provide, for each of the detected one or more objects, an identification of a class of the detected object and an identification of a region of the detected object in the captured product image, wherein the class of the detected object is either an acceptable product feature class or an unacceptable product feature class;

using the inspection station computer system to receive, for each of the detected one or more objects, the identification of the class of the detected object and the identification of the region of the detected object in the captured product image; and using the inspection station computer system to cause a display of the inspection station to display an enhanced product image that includes the conveyed captured product image to which the identification of the class of the detected object and the identification of the region of the detected object in the captured product image for each of the detected one or more objects have been added.

2. The method of claim 1, further comprising using the server computer system to create the enhanced product image by adding the identification of the class of the detected object and the identification of the region of the detected object in the captured product image for each of the detected one or more objects to the conveyed captured product image;

wherein using the inspection station computer system to receive, for each of the detected one or more objects, the identification of the class of the detected object and the identification of the region of the detected object in the captured product image comprises receiving the enhanced product image.

3. The method of claim 1, further comprising using the inspection station computer system to create the enhanced product image by adding the identification of the class of the detected object and the identification of the region of the detected object in the captured product image for each of the detected one or more objects to the conveyed captured product image.

4. The method of claim 1, wherein using the ML model of the server computer system to detect the one or more objects in the captured product image comprises:

for each class of a set of classes, using the ML model of the server computer system to determine a probability that the captured product image includes a object of the class in a region of the captured product image; and for each determined probability that exceeds a probability threshold, determining that the region of the captured product image includes the object of the class.

5. The method of claim 4, wherein the product is a wire harness, and the set of classes includes two or more of the following classes: an acceptable endcap placement class, an unacceptable endcap placement class, an acceptable tie wrap class, an unacceptable tie wrap class, an acceptable sleeve placement class, an unacceptable sleeve placement class, an acceptable crimp class, an unacceptable crimp class, an acceptable jacket placement class, an unacceptable jacket placement class, an acceptable placed lugs class, an unacceptable placed lugs class, an acceptable heated heat shrink class, an unacceptable heated heat shrink class, an acceptable weld class, an unacceptable weld class, an acceptable shield braid class, and an unacceptable shield braid class.

6. The method of claim 1, wherein the product is a wire harness, and the one or more product features are wire harness features.

7. The method of claim 1, further comprising training the ML model of the server computer system.

8. The method of claim 7, wherein training the ML model comprises:

loading a training dataset to the server computer system, wherein the training dataset comprises training product images and, for each training product image of the training product images, an identification of a class of a object in the training product image and an identification of a region of the object in the training product image, wherein the class of the object is either an acceptable product feature class or an unacceptable product feature class; and training the ML model using the loaded training dataset.

9. The method of claim 8, wherein training the ML model further comprises:

using a camera of a training station to output a video stream including images of a training product in a field of view of the camera of the training station, wherein a stand of the training station positions the camera of the training station, and the training product images include one or more of the images of the training product in the field of view of the camera of the training station; and using a training station computer system of the training station to receive the video stream output by the camera of the training station.

10. The method of claim 9, wherein training the ML model further comprises using a robot arm of the training station to position the training product in the field of view of the camera of the training station.

11. The method of claim 1, further comprising using a light of the inspection station to illuminate the product in the field of view of the camera, wherein the stand of the inspection station positions the light.

12. The method of claim 11, wherein the light of the inspection station is a light emitting diode (LED) ring light.

13. The method of claim 1, wherein the camera of the inspection station has a resolution of at least 13MP.

14. The method of claim 1, wherein the video output by the camera of the inspection station has at least a 4K resolution.

15. The method of claim 1, further comprising using an image repository to store the conveyed captured product image and, for each of the detected one or more objects, the identification of the class of the detected object and the identification of the region of the detected object in the captured product image.

16. An inspection system comprising:

an inspection station including:
a camera configured to output a video stream including captured product images of a product in a field of view of the camera, wherein the product includes one or more product features;
a stand configured to position the camera;
a display; and
an inspection station computer system configured to:
receive the video stream; and
convey a captured product image of the captured product images;

a server computer system comprising a machine learning (ML) model, wherein the server computer system is configured to:
receive the conveyed captured product image; and
use the ML model of the server computer system to detect one or more objects in the captured product image and provide, for each of the detected one or more objects, an identification of a class of the detected object and an identification of a region of the detected object in the captured product image, wherein the class of the detected object is either an acceptable product feature class or an unacceptable product feature class; wherein the inspection station computer system is further configured to:

receive, for each of the detected one or more objects, the identification of the class of the detected object and the identification of the region of the detected object in the captured product image; and cause the display to display an enhanced product image that includes the conveyed captured product image to which the identification of the class of the detected object and the identification of the region of the detected object in the captured product image for each of the detected one or more objects have been added.

17. The inspection system of claim 16, wherein:

the server computer system is further configured to create the enhanced product image by adding the identification of the class of the detected object and the identification of the region of the detected object in the captured product image for each of the detected one or more objects to the conveyed captured product image; and the inspection station computer system is further configured to, in receiving, for each of the detected one or more objects, the identification of the class of the detected object and the identification of the region of the detected object in the captured product image, receiving the enhanced product image.

18. The inspection system of claim 16, wherein the inspection station computer system is further configured to create the enhanced product image by adding the identification of the class of the detected object and the identification of the region of the detected object in the captured product image for each of the detected one or more objects to the conveyed captured product image.

19. The inspection system of claim 16, wherein the server computer system, in detecting one or more objects in the captured product image, is configured to:

for each class of a set of classes, use the ML model to determine a probability that the captured product image includes a object of the class in a region of the captured product image; and for each determined probability that exceeds a probability threshold, determine that the region of the captured product image includes the object of the class.

20. The inspection system of claim 19, wherein the product is a wire harness, and the set of classes includes two or more of the following classes: an acceptable endcap placement class, an unacceptable endcap placement class, an acceptable tie wrap class, an unacceptable tie wrap class, an acceptable sleeve placement class, an unacceptable sleeve placement class, an acceptable crimp class, an unacceptable crimp class, an acceptable jacket placement class, an unacceptable jacket placement class, an acceptable placed lugs class, an unacceptable placed lugs class, an acceptable heated heat shrink class, an unacceptable heated heat shrink class, an acceptable weld class, an unacceptable weld class, an acceptable shield braid class, and an unacceptable shield braid class.

21. The inspection system of claim 16, wherein the product is a wire harness, and the one or more product features are wire harness features.

22. The inspection system of claim 16, wherein the server computer system is further configured to train the ML model using a training dataset that comprises training product images and, for each training product image of the training product images, an identification of a class of a object in the training product image and an identification of a region of the object in the training product image, and the class of the object is either an acceptable product feature class or an unacceptable product feature class.

23. The inspection system of claim 22, further comprising a training station including:

a camera configured to output a video stream including images of a training product in a field of view of the camera of the training station, wherein the training product images include one or more of the images of the training product in the field of view of the camera of the training station;

a stand configured to position the camera of the training station; and a training station computer system configured to receive the video stream output by the camera of the training station.

24. The inspection system of claim 23, wherein the training station further comprises a robot arm configured to position the training product in the field of view of the camera of the training station.

25. The inspection system of claim 16, wherein the inspection station further comprises a light configured to illuminate the product in the field of view of the camera, wherein the stand of the inspection station is configured to position the light.

26. The inspection system of claim 25, wherein the light of the inspection station is a light emitting diode (LED) ring light.

27. The inspection system of claim 16, wherein the camera of the inspection station has a resolution of at least 13MP.

28. The inspection system of claim 16, wherein the video output by the camera of the inspection station has at least a 4K resolution.

29. The inspection system of claim 16, further comprising an image repository configured to store the conveyed captured product image and, for each of the detected one or more objects, the identification of the class of the detected object and the identification of the region of the detected object in the captured product image.

* * * * *